(12) United States Patent
Kubo et al.

(10) Patent No.: US 7,866,800 B2
(45) Date of Patent: Jan. 11, 2011

(54) LIQUID DROPLET JETTING APPARATUS AND METHOD FOR MANUFACTURING LIQUID DROPLET JETTING APPARATUS

(75) Inventors: Tomoyuki Kubo, Nagoya (JP); Koji Imai, Inuyama (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 285 days.

(21) Appl. No.: 12/288,056

(22) Filed: Oct. 16, 2008

(65) Prior Publication Data
US 2009/0096842 A1 Apr. 16, 2009

(30) Foreign Application Priority Data
Oct. 16, 2007 (JP) .............................. 2007-269173

(51) Int. Cl.
*B41J 2/045* (2006.01)
*B21D 53/76* (2006.01)

(52) U.S. Cl. ........................................ 347/68; 29/890.1

(58) Field of Classification Search .................. 347/71, 347/148
See application file for complete search history.

(56) References Cited

U.S. PATENT DOCUMENTS 7,294,952 B2  11/2007  Ito
7,536,762 B2 *  5/2009  Imai et al. .................. 29/25.35
2004/0113994 A1 *  6/2004  Shinkai ........................ 347/68
2006/0061633 A1 *  3/2006  Nakayama .................... 347/71
2007/0182787 A1  8/2007  Kubo et al.
2007/0229606 A1 *  10/2007  Taira et al. ..................... 347/71

FOREIGN PATENT DOCUMENTS

| JP | 2004-79872 | 3/2004 |
| JP | 2005-322850 | 11/2005 |
| JP | 2007-203482 | 8/2007 |

\* cited by examiner

*Primary Examiner*—Matthew Luu
*Assistant Examiner*—Lisa M Solomon
(74) *Attorney, Agent, or Firm*—Frommer Lawrence & Haug LLP

(57) ABSTRACT

A liquid droplet jetting apparatus includes: a liquid droplet jetting head which jets liquid droplets when an actuator is driven; and a wiring member via which a drive signal is outputted to a surface electrode formed in the actuator. The wiring member includes a substrate, a wire provided on the substrate, and a covering member having an insulating property and covering the wire. The wire has an electrode land which is stacked on the surface electrode to be connected to the surface electrode, and the covering member has a first covering layer in which a first opening to expose the electrode land therein is formed and a second covering layer having a second opening communicating with the first opening and covering the first covering layer. The surface electrode and the electrode land are connected in a state that an electroconductive material is interposed therebetween through the first and second openings.

13 Claims, 14 Drawing Sheets

LIQUID DROPLET JETTING APPARATUS AND METHOD FOR MANUFACTURING LIQUID DROPLET JETTING APPARATUS

CROSS REFERENCE TO RELATED APPLICATION

The present application claims priority from Japanese Patent Application No. 2007-269173, filed on Oct. 16, 2007, the disclosure of which is incorporated herein by reference in its entirety.

BACKGROUND OF THE INVENTION

1. Field of the Invention

The present invention relates to a liquid droplet jetting apparatus such as an ink-jet printer.

2. Description of the Related Art

An ink-jet printer as an example of a liquid droplet jetting apparatus, includes an ink-jet head which jets ink droplets supplied from an ink tank, toward a recording paper from nozzles. This ink-jet head is provided with a channel unit which makes jet ink droplets from a plurality of nozzles, and an actuator (such as a PZT) which generates a pressure for jetting the ink droplets as described in US Patent Application Publication No. 2007/0182787 (corresponds to Japanese Patent Application Laid-open No. 2007-203482) for example. A plurality of surface electrodes provided on an uppermost surface of the actuator, and an electrode land of a flexible wiring member such as an FPC (Flexible Printed Circuit) and a COF (Chip On Film) are connected via an electroconductive adhesive such as solder.

Moreover, joining the ink-jet head including an actuator and a channel unit to a flexible wiring member by solder is not quite preferable, since an effect of a heat, which is imparted to the actuator and the channel unit at the time of melting the solder in a high-temperature environment as in a reflow process, is substantial. Moreover, due to unevenness of an actuator surface and curling of the flexible wiring member, there is a variation in a distance between electrodes. Therefore, for joining assuredly the melted solder between the electrodes, instead of the reflow, it is necessary to absorb a variation in a solder height by heating and pressing from above a wiring member by a bar heater as described in US Patent Application Publication No. 2007/0182787.

Incidentally, at the time of connecting the electrodes of an electronic equipment etc. in general, solder or solder paste melted by heating is interposed between the electrodes. Sometimes, the excessive solder outflows from a gap between the electrodes, and moves to other electrode portion, and induces a problem of short-circuit etc. Therefore, various proposals have hitherto been made for preventing the short-circuit due to the excessive solder.

For instance, in a soldered structure of an electronic circuit unit of Japanese Patent Application Laid-open No. 2004-79872, a circuit board and a mother board having patterns thereon respectively are stacked up and down to be connected mutually. The circuit board has a first resist layer and the mother board has a second resist layer to protect the respective patterns, and by removing a part thereof, each land is provided. A wall portion made of an insulating material is arranged between the resist layers, surrounding each electrode land. Accordingly, even when the solder applied on the land is melted in the reflow step, it is possible to prevent the excessive solder from leaking out.

In recent years, in an ink-jet head as disclosed in US Patent Application Publication No. 2007/0182787, a size reduction, an increase in the number of channels (multi-channel use), and a high densification have been carried forward. In accordance with this, since a plurality of surface electrodes is arranged highly densely in a limited surface area of the actuator, a distance between adjacent surface electrodes has become extremely narrow. Therefore, when an excessive solder between the surface electrode and the electrode land is leaked out, the leaked solder easily reaches the adjacent surface electrode, and a possibility of the short-circuit between the circuit electrodes becomes even higher.

Moreover, in the soldered structure in Japanese Patent Application Laid-open No. 2004-79872, as shown in FIG. 5, a wall portion 13 and a second resist layer 12 are arranged to surround a second land of a mother board 58, and carry out a function of holding solder provided to a first land by the wall portion 13 and the second resist layer 12. However, regarding the surface electrode (which is the second land) on the actuator (which is the mother board) of the ink-jet head according to the soldered structure of the Japanese Patent Application Laid-open No. 2004-79872, since the surface electrodes are arranged highly densely, and the gap between adjacent electrodes is extremely narrow, it is not practical to provide a structure such as the second resist layer 12 or the wall portion 13 on the actuator, and it is difficult to ensure a reliability of the electrode. Therefore, a solution for a problem of short-circuit, due to flowing of the excessive solder from a gap between the surface electrode and the electrode land which are arranged on the surface of the actuator has been sought further.

Moreover, in a case of the structure described in Japanese Patent Application Laid-open No. 2004-79872, the electrode land stacked up and down have the same area, and by highly densifying the electrode lands, a solder space formed by the electrode land, the resist, and the wall portion becomes small. In other words, a connecting area (an electrode surface and an exposed area of the land) of the solder becomes extremely small, and it is necessary to apply a solder of a fine diameter (extremely small amount). However, due to the extremely small amount of solder, there has been a problem that a variation in the amount is occured.

Moreover, since the connecting area of the land becomes small, and the amount of solder becomes extremely small, there may occur a case, in which the land is not joined appropriately to the surface electrode. Furthermore, due to the unevenness of the actuator, the curling of the flexible wiring member, and the contamination of the electrode surface, it is difficult to join appropriately, mechanically and electrically by absorbing the variation in the distance between the land and the electrode by the solder. Moreover, when the amount of solder becomes large, since a solder space between the land and a terminal is small, there is a risk of the solder leaking out beyond the wall portion. Furthermore, since the distance between adjacent surface electrodes is small, the short-circuit is susceptible to occur.

Moreover, in the ink-jet head, when the heating temperature is low and when there is a deviation in a pressure applied at the time of heating and pressing for melting the solder, a mechanical joining strength becomes insufficient. In this case, an exfoliation of a joint portion and a variation in joints of solder are occurred during use or during a manufacturing process. Whereas, when the heating temperature is high and the pressure applied is high, the solder leaks out to the surface of the actuator from the gap between the surface electrodes which are stacked face-to-face, and the solder which has leaked reaches the adjacent surface electrode. Therefore short-circuit tends to occure.

In this manner, in the ink-jet head in which a large number of channels are arranged highly densely, due to the solder space (connecting area) which connects, becoming small, it becomes difficult to control the amount of solder, the heating, and pressurizing. Therefore, even when the structure as described in Japanese Patent Application Laid-open No. 2004-79872 is used, it is not possible to prevent completely the short-circuit between adjacent electrodes by controlling the variation in the joints.

SUMMARY OF THE INVENTION

In view of the abovementioned circumstances, an object of the present invention is to prevent appropriately the short-circuit which occurs at the time of soldering the electrode land of the wiring member to the surface electrode of the actuator of the liquid droplet jetting head which are used in a liquid droplet jetting apparatus.

According to a first aspect of the present invention, there is provided a liquid droplet jetting apparatus which jets droplets of liquid, including: a liquid droplet jetting head which jets liquid droplets when an actuator having a plurality of energy generating portions, is driven; and a wiring member via which a drive signal is outputted to a surface electrode formed in the actuator, the wiring member including an insulative substrate, a wire provided on one surface of the substrate, and a covering member having an insulating property and covering the wire, the wire having an electrode land which is stacked on the surface electrode to be connected to the surface electrode, the covering member having a first covering layer in which a first opening to expose the electrode land therein is formed and a second covering layer having a second opening communicating with the first opening and covering the first covering layer, wherein the second opening is formed so as to face the surface electrode; a circumference of the second opening is greater than a circumference of the first opening; an area of the surface electrode is greater than an exposure area of the electrode land; the surface electrode is projected partially toward an outside of the electrode land; and the surface electrode and the electrode land are connected in a state that an electroconductive material is interposed between the surface electrode and the electrode land through the first opening and the second opening.

In the liquid droplet jetting apparatus of the present invention, the electroconductive material may be solder.

According to the first aspect of the present invention, since the area of the surface electrode is greater than the exposure area of the electrode land, and the surface electrode is partially projected toward the outside of the electrode land, the surface electrode and the electrode land are connected in the state of the solder interposed between the surface electrode and the electrode land. Even when the solder is substantial in amount, the excessive amount of solder spreads on the surface electrode when heated. Furthermore, since the second opening is formed so as to face the surface electrode, and the circumference of the second opening is greater than the circumference of the first opening, the second opening defines a solder accommodating space along the surface electrode, and the solder which has melted is accommodated in this solder accommodating space. Consequently, it becomes possible to prevent appropriately a short-circuit due to flowing of the melted solder up to a gap between adjacent surface electrodes. Moreover, since the melted solder spreads on the surface electrode having the area greater than the exposure area of the electrode land, sufficient area of joining of the solder and the surface electrode is secured, and it is possible to contribute also to an improvement in a joining strength.

In the liquid droplet jetting apparatus of the present invention, a volume of a space defined by the first opening and the second opening may include an additional space other than a volume occupied by the solder. According to this structure, for instance, when there is a variation in the amount of solder at the time of soldering, when the actuator or the wiring member is curled, or when a pressure applied is substantial, since the melted solder is accommodated in the excessive space, it is possible to prevent the solder from leaking out. Moreover, it is possible to deal with a variation in the connections at the time of soldering.

In the liquid droplet jetting apparatus of the present invention, a connecting terminal having an area smaller than the area of the surface electrode may be provided on a surface of the surface electrode, at a portion facing the electrode land; the electrode land may be connected with the connecting terminal via the solder to be conducted with the surface electrode; a portion, of the solder, outflowing from a surface of the connecting terminal may be spread on the surface electrode, and the second opening may surround the spread solder. In this case, even when the melted solder comes out from the connecting terminal, the excessive portion which has come out is spread on the surface and accommodated in the second opening. Accordingly, it is possible to prevent the melted solder from shorting the surface electrodes.

In the liquid droplet jetting apparatus of the present invention, the solder may be interposed between the connecting terminal and the electrode land through the first opening and the second opening; and a portion of the solder may be overflowed from a gap between the connecting terminal and the electrode land and may be spread up to the partially projected area of the surface electrode. In this case, even when the melted solder interposed between the connecting terminal and the electrode land has overflowed from the gap between the connecting terminal and the electrode land, since the excessive solder spreads on an area projected outward partially from the electrode land of the surface electrode, an area of joining with the solder becomes substantial. Therefore, the electric connection as well as the mechanical connection between the surface electrode and the land is firm, and exfoliation hardly occurs.

In the liquid droplet jetting apparatus of the present invention, the surface electrode may be provided as a plurality of individual surface electrodes and a common surface electrode which is connected in common to the energy generating portions, each of the individual surface electrodes extending in a predetermined direction in a form of a belt and being connected to one of the energy generating portions, the individual surface electrodes being arranged in the predetermined direction to form a plurality of individual surface electrode-rows which are arranged in a direction orthogonal to the predetermined direction; the electrode land may be provided as a plurality of individual electrode lands each corresponding to one of the individual surface electrodes and a common electrode land corresponding to the common surface electrode; the connecting terminal may be provided as a plurality of individual connecting terminals each of which is provided at a portion of a surface, of one of the individual surface electrodes, facing one of the individual electrode lands, and a common connecting terminal provided at a portion of a surface, of the common surface electrode, facing the common electrode land; each of the individual connecting terminals may be shorter than one of the individual surface electrodes; the individual connecting terminals may be arranged alternately in a direction orthogonal to the predetermined direction alternately at one end portion and the other end portion in a longitudinal direction of the individual surface electrodes;

the individual electrode lands may be arranged in a plurality of individual electrode land-rows corresponding to the individual connecting terminals, and the wire is provided as a plurality of wires wired through gaps between the individual electrode lands; and the portion of the solder outflowed from one of the individual connecting terminals may be spread inside the circumference of the second opening. According to this structure, since the individual connecting terminals and the individual electrode lands are arranged in a zigzag form, it is possible to secure a wide gap between adjacent electrode lands, while arranging a plurality of rows of the individual electrode lands. Accordingly, it becomes easy to wire the individual electroconductive wire in the wiring member through the gap between the individual electrode lands, and it is possible to facilitate high densification. Moreover, since the excessive amount of the melted solder spreads from a side of the individual connecting terminal up to a circumferential end of the second opening on an opposite side thereof, along the individual surface electrode on which the individual connecting terminal is provided, it is possible to prevent the short-circuit between adjacent individual surface electrodes which are arranged densely, while having a firm electrical and mechanical joining.

In the liquid droplet jetting apparatus of the present invention, the common surface electrode may be formed on the surface of the actuator on both sides with the individual surface electrodes sandwiched therebetween; a plurality of common connecting terminals may be provided on the common surface electrode at an interval; and the second opening corresponding to the common electrode land may be open to have an opening area substantially same as that of the second opening facing the individual electrode lands. According to this structure, by forming the area of the second opening facing the common electrode land to be substantially same as the area of the second opening facing the individual electrode land, it is possible to make uniform the shape of the solder between the common electrode land and the individual electrode land. Accordingly, electrical and mechanical connections between the wiring member and the actuator as a whole are stabilized. Moreover, in a case of forming the second opening in the second covering layer by a photolithography, since the area of the second opening for the common electrode land and the individual electrode land is substantially the same, it is possible to use same mask pattern for a photo mask, and the manufacturing becomes easy.

In the liquid droplet jetting apparatus of the present invention, the first opening may be formed as a plurality of first openings and the first covering layer may continuously cover the substrate between adjacent first openings among the plurality of first openings. According to this structure, since the first covering layer is not lacking between adjacent first openings, a strength of the wiring member improves. Therefore, it is possible to prevent a so-called cross-talk phenomenon in which an energy of the energy generating portion corresponding to a certain first opening is transmitted to the energy generating portion corresponding to the adjacent first opening via the wiring member.

In the liquid droplet jetting apparatus of the present invention, the second opening may be formed as a plurality of second openings and the second covering layer may continuously cover the first covering layer between adjacent second openings among the plurality of second openings, at an area of the second covering layer facing the actuator. According to this structure, sine the first covering layer is not missing between adjacent second openings, the strength of the wiring member improves. Accordingly, it is possible to prevent assuredly the so-called cross-talk phenomenon in which an energy of the energy generating portion corresponding to a certain second opening is transmitted to the energy generating portion corresponding to adjacent second opening. Moreover, by not providing the second covering layer in the area of the wiring member, not facing the actuator, it is possible to secure flexibility of the wiring member.

According to a second aspect of the present invention, there is provided a method for manufacturing liquid droplet jetting apparatus including a liquid droplet jetting head which jets liquid droplets when an actuator having a plurality of energy generating portions is driven, and a wiring member which outputs a drive signal to a plurality of surface electrodes of the actuator, the method including: arranging a plurality of wires on a surface of a substrate of the wiring member; forming, on the substrate, a first covering layer having a plurality of first openings via which a plurality of electrode lands, of the wires, are exposed respectively; forming, on the first covering layer, a second covering layer having a plurality of second openings which communicate with the first openings respectively and are facing the surface electrodes respectively, each of the second openings having a circumference greater than a circumference of one of the first openings; arranging a bump of an electroconductive material on each of the electrode lands in each of the first openings; stacking the wiring member on the actuator so as to make each of the electrode lands face one of the surface electrodes via the bump of an electroconductive material; and pressurizing the stacked wiring member toward the actuator and heating the wiring member to connect the electrode lands and the surface electrodes respectively in a state that the electroconductive material is interposed between each of the electrode lands and one of the surface electrodes.

According to the second aspect of the present invention, since the area of the surface electrode is greater than the exposed area of the electrode land, and the surface electrode is projected partially toward outside of the electrode land, even when an amount of the electroconductive material provided on the electrode land is large, the excessive amount spreads on the surface electrode when melted. Furthermore, since the second opening is open toward the surface electrode, and the circumference thereof is greater than the circumference of the first opening, the second opening defines an accommodating space for the electroconductive material along the surface electrode, and the electroconductive material is accommodated in this space. Consequently, even when there is a deviation due to the control of pressurizing and heating, or a variation in the amount of the electroconductive material, it is possible to prevent appropriately the electroconductive material from causing a short-circuit between two adjacent surface electrodes.

The method for manufacturing liquid droplet jetting apparatus of the present invention may further include: providing, on the surface electrodes, connecting terminals each having an area smaller than an area of a surface, of one of the surface electrodes, facing one of the electrode lands, at positions, corresponding to the electrode lands respectively, and the electrode lands and the surface electrodes may be brought into electrical conduction by connecting the electrode lands with the connecting electrodes respectively via the electroconductive material. Moreover, the electroconductive material may be solder. In this case, by the electrode land being connected to the connecting terminal on the surface electrode by solder, the electrode land and the surface electrode are brought into electrical conduction, and the excessive solder outflowing from the connecting terminal is accommodated in the second opening to avoid the leakage of the solder. Therefore, it is possible to avoid appropriately the short-circuit between the surface electrodes.

In the method of manufacturing liquid droplet jetting apparatus of the present invention, upon connecting the connecting terminals with the electrode lands respectively, pressurizing and heating may be performed such that a solder overflowing from a gap between each of the connecting terminals and one of the electrode lands spreads on each of the surface electrodes. In this case, since the pressurizing and heating are performed such that the excessive solder which has overflowed from the gap between the connecting terminal and the electrode land spreads on the surface electrode, in a state that the melted solder is interposed between the connecting terminal and the electrode land, a connecting area of the solder becomes wide, and the electrical connection between the surface electrode and the land becomes firm, thereby making it possible to have an assured mechanical connection.

DETAILED DESCRIPTION OF THE PREFERRED EMBODIMENTS

An embodiment of a liquid droplet jetting apparatus according to the present invention will be described below letting an ink-jet printer as an example. In the following description, a direction of jetting an ink from an ink-jet head which jets the ink of the ink-jet printer is let to be a downward direction, and a direction opposite to the downward direction is let to be an upward direction.

Figure 1:
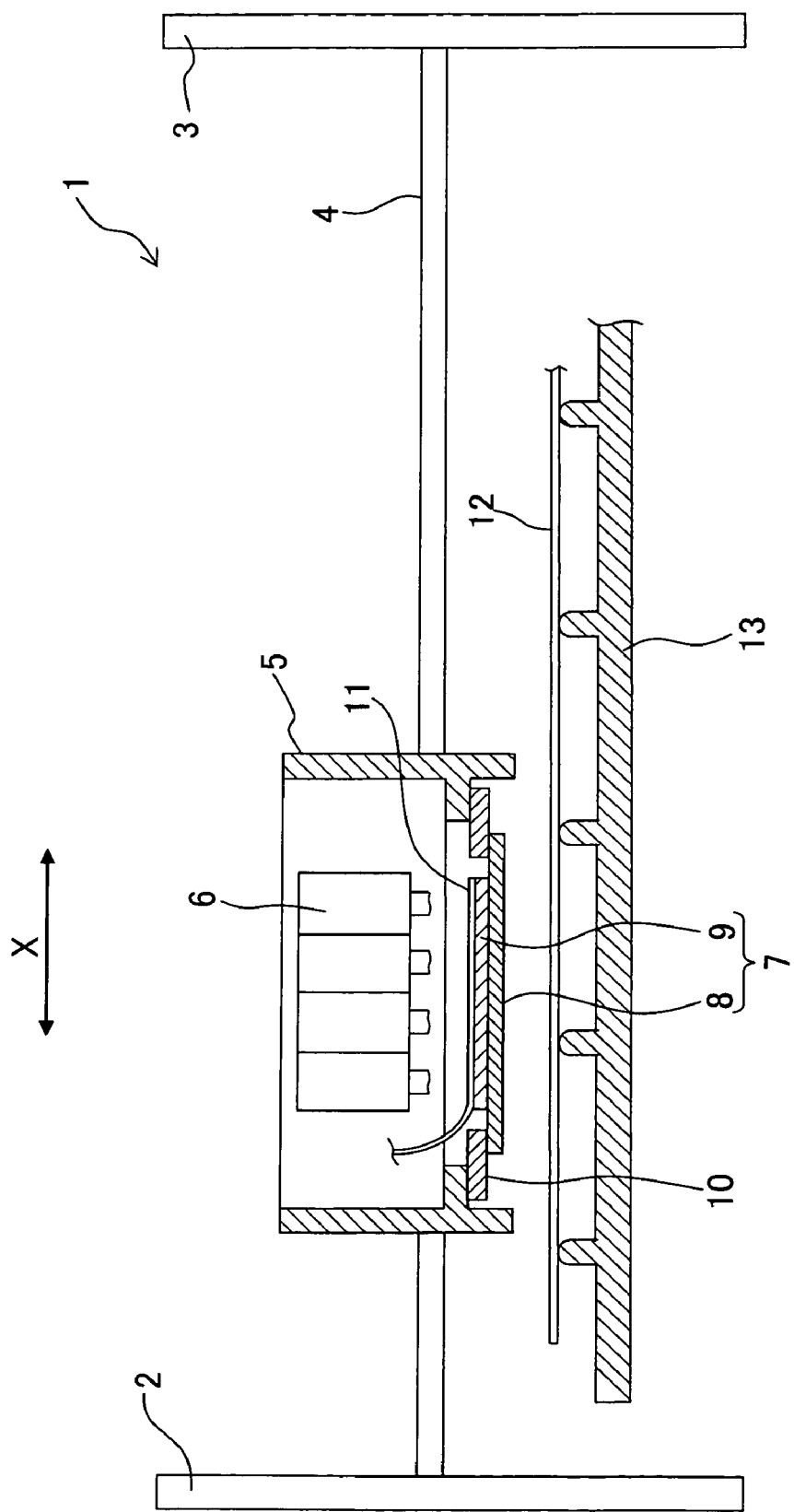
FIG. 1 is a front view of an ink-jet printer according to an embodiment of the present invention.

FIG. 1 is a front view of an ink-jet printer 1 according to the embodiment of the present invention. As shown in FIG. 1, in the ink-jet printer 1, a guide shaft 4 supported by frames 2 and 3 on left and right sides respectively is installed to be extended in a left-right direction. A carriage 5 is slidably supported in the left-right direction (scanning direction: X direction) by the guide shaft 4. The carriage 5 is joined to a timing belt (not shown in the diagram) which reciprocates in the left-right direction. By reciprocating of the timing belt by a motor (not shown in the diagram), the carriage 5 reciprocates in the left-right direction.

Four ink tanks 6 corresponding to inks of four colors (namely black, cyan, magenta, and yellow) are provided on an upper surface side of the carriage 5, and the ink is supplied independently from an ink cartridge of each ink not shown in the diagram, to the ink tank 6 via an ink tube. An ink-jet head 7 including a channel unit 8 and an actuator 9 is installed on a lower surface side of the carriage 5 via a supporting frame 10, and one end side of a wiring member 11 is joined to the actuator 9 of the ink-jet head 7. At a lower side of the ink-jet head 7, a platen 13 which supports a recording paper 12 is arranged in a printing area. The carriage 5 reciprocates in X direction, and the ink is jetted downward from the ink-jet head 7 on to the recording paper 12 transported in Y direction which is orthogonal to X direction (refer to FIG. 2).

Figure 2:
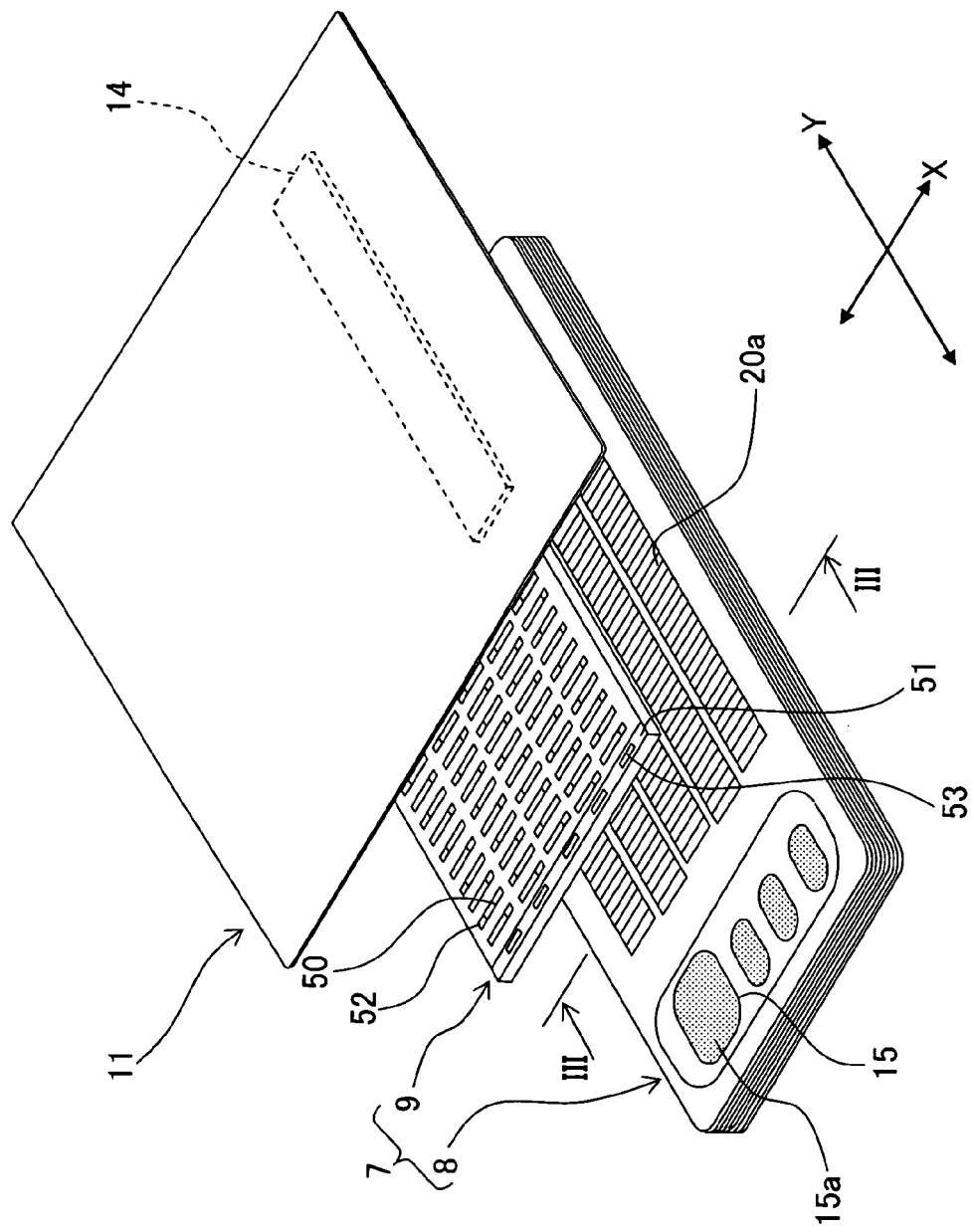
FIG. 2 is an exploded perspective view of an ink-jet head and a wiring member of the ink-jet printer shown in FIG. 1.

FIG. 2 is an exploded perspective view of the ink-jet head 7 and the wiring member 11 of the ink-jet printer 1 shown in FIG. 1. As shown in FIG. 2, the ink-jet head 7 includes the channel unit 8 in which, a plurality of plates is stacked, and the actuator 9 of a piezoelectric drive type which is adhered upon overlapping on the channel unit 8. Nozzles 28a which are open in a lower surface are formed in the channel unit 8 (refer to FIG. 3), and the ink (liquid) is jetted downward from nozzles 28a. An ink supply port 15 is formed on one side in an upper surface in a longitudinal direction (Y direction) of the channel unit 8. When the ink-jet head 7 is mounted on the carriage 5, the ink supply port 15 communicates with an ink inflow port not shown in the diagram, of the ink tank 6, and the ink of each color is supplied into the channel unit 8 from the ink tank 6.

A filter 15a for removing dust mixed with the ink supplied is provided to the ink supply port 15. Surface electrodes 50 and 51 for applying on piezoelectric sheets 41, 42, 43, and 44, a drive voltage for jetting the ink are formed on an upper surface of the actuator 9. On the surface electrodes 50 and 51, the one end side of the flat and flexible wiring member 11 for electrically connecting with an external equipment is arranged to be overlapping, and joined electrically. A driving IC chip 14 which outputs a drive signal for selectively driving the actuator 9 based on printing data is mounted on the wiring member 11.

Figure 3:
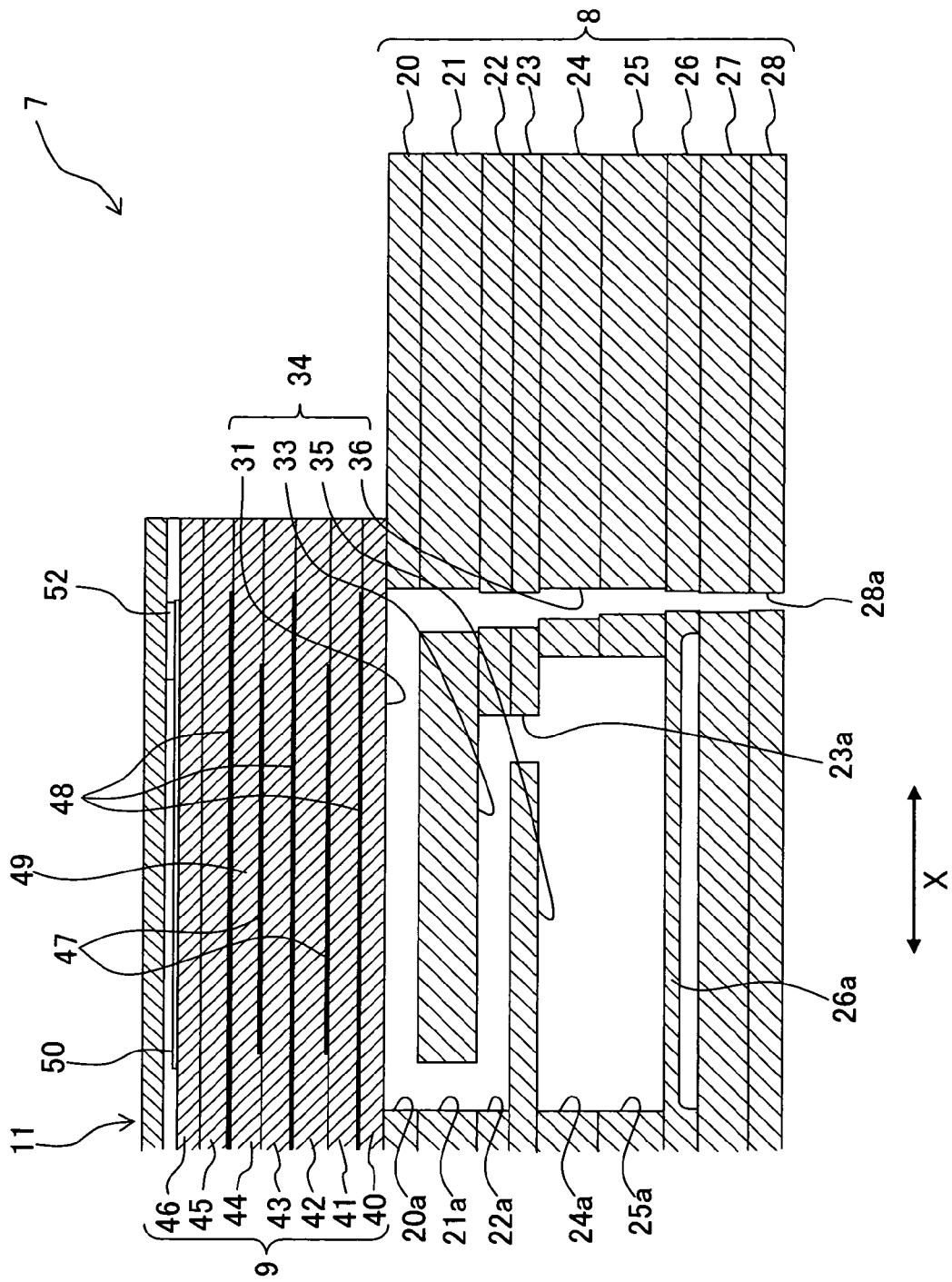
FIG. 3 is an enlarged view of main components, of a cross-section taken along a line III-III in FIG. 2.

FIG. 3 is an enlarged view of main components, of a cross-section taken along a line III-III in FIG. 2. As shown in FIG. 3, the channel unit 8 of the ink-jet head 7 includes in order from an upper side, a pressure chamber plate 20, a first spacer plate 21, a diaphragm plate 22, a second spacer plate 23, a first manifold plate 24, a second manifold plate 25, a damper plate 26, a cover plate 27, and a nozzle plate 28, and these plates are stacked in this order and adhered mutually.

From among these plates, the nozzle plate 28 is a resin sheet of a material such as polyimide. The rest of the plates 21 to 27 except for the nozzle plate 28 are metallic plates of a material such as 42% nickel alloy steel plate (42 alloy). Each of the plates 20 to 28 has a rectangular shape in a plan view, and has a thickness of about 50 μm to 150 μm. An opening or a groove forming an ink channel is formed in each of the plates 20 to 27 by a method such as an electrolytic etching, a laser machining, and a plasma jet machining.

A plurality of nozzles 28a (nozzle diameter 20 μm) having a fine diameter, for jetting liquid droplets is formed at a fine interval in a longitudinal direction of the nozzle plate 28 which is positioned at the lowermost layer in the channel unit 8. These nozzles 28a are arranged in five parallel rows in the longitudinal direction (Y direction). In other words, a plurality of nozzles 4 forms nozzle rows extending along Y direction for each ink color, and the nozzle rows are arranged along X direction.

A plurality of pressure chamber holes 20a are formed in five rows corresponding to the rows of the nozzles 28a in the pressure chamber plate 20 positioned at the uppermost layer in the channel unit 8. The pressure chamber holes 20a have a long and slender shape in a plan view, having a short axis direction (X direction) of the pressure chamber plate 20 as the longitudinal direction, and are formed through a thickness of the pressure chamber plate 20. In other words, the pressure chamber holes 20a are arranged such that, the longitudinal direction thereof is along a direction (X direction) orthogonal to the rows of the nozzles 28a. A pressure chamber 31 (liquid chamber) is formed by the actuator 9 being stacked on the pressure chamber hole 20a from an upper side, and the first spacer plate 21 being stacked on the pressure chamber hole 20a from a lower side.

A communicating hole 21a which communicates with one end portion of the pressure chamber 20a is formed in the first spacer plate 21, and a communicating hole 23a is formed in the second spacer plate 23. A diaphragm hole 22a is formed in the diaphragm plate 22 which is interposed between the first spacer plate 21 and the second spacer plate 23. One end portion of the diaphragm hole 22a communicates with the communicating hole 21a in the first spacer plate 21, and the other end portion of the diaphragm hole 22a communicates with the communicating hole 23a of the second spacer plate 23. A diaphragm passage 33 which makes communicate the pressure chamber 31 and a common liquid chamber 35 which will be described later is formed by the communicating holes 21a and 23a, and the diaphragm hole 22a. Moreover, the other end portion of each pressure chamber hole 20a forms a liquid channel 36 communicating with each nozzle 28a of the nozzle plate 28 via a communicating hole of a minute diameter formed, in the first spacer plate 21, the diaphragm plate 22, the second spacer plate 23, the two manifold plates 24 and 25, the damper plate 26, and the spacer plate 27.

Manifold holes 24a and 25a extending along a direction of row (Y direction) of the pressure chamber holes 20a are formed in the first manifold plate 24 and the second manifold plate 25 positioned at a lower layer of the second spacer plate 23, at lower side positions corresponding to a position at which the pressure chamber holes 20a are arranged in the direction of row (Y direction). The manifold holes 24a and 25a are arranged in five rows corresponding to the nozzle rows and the pressure chamber rows. Five common liquid chambers 35 in all are formed by stacking the two manifold plates 24 and 25, and covering an upper surface thereof by the second spacer plate 23, and then covering a lower surface thereof by the damper plate 26. The manifold hole 24a communicates with the pressure chamber 31 via the diaphragm passage 33. Moreover, one end portion in a longitudinal direction of the manifold holes 24a and 25a communicates with the ink supply port 15 which is cut through vertically corresponding to the position, at one end side in a longitudinal direction (Y direction) of each of the plates 20 to 23 from the pressure chamber plate 20 up to the second spacer plate 23.

The damper plate 26 has five damper walls 26a which are thin walls formed by making hollow from a lower side, a location corresponding to a position of each common liquid chamber 35 of a surface on a side not facing the common liquid chamber 35 on a surface at an opposite side of a surface facing the common liquid chamber 35. Moreover, a damper chamber is formed in the damper plate 26 by the cover plate 27 being stacked and adhered from a lower side, and furthermore, the nozzle plate 28 having through holes which become nozzles 28a is adhered from a lower side on the cover plate 27.

Four ink supply ports 15 are formed, whereas, five rows of damper chambers, common liquid chambers 24a and 25a, the nozzles 28a, and the pressure chambers 31a are provided. This is because, a frequency of use of the black ink is higher as compared to the other color inks, and the black ink is supplied from the ink supply port 15 for the black ink, to the two common liquid chambers 24a and 25a, two nozzle rows, and two pressure chamber rows.

The ink channels 34 from an ink supply port (not shown in the diagram) communicating with the ink tank 6 reaching up to the nozzle 28a via the common liquid chamber 35, the aperture passage 33, the pressure chamber 31, and the nozzle passage 36 are formed in the channel unit 8 which is formed by stacking and adhering the plates 20 to 28 in such manner.

The piezoelectric actuator 9 is formed by stacking and adhering a plurality of piezoelectric sheets 40 to 45 formed to be substantially similar rectangular shaped in a plan view, and a top sheet 46 which has an insulating property. The piezoelectric sheets 40 to 45 are formed of a ceramics material of such as lead zirconium titanate, and each piezoelectric sheet has a thickness of about 30 μm. The actuator 9 formed in the form of a rectangular plate in a plan view is formed to be smaller than outer dimensions of the channel unit 8. As shown in FIG. 2, the actuator 9 is joined to an upper surface of the channel unit 8 such that, a position of an individual electrode 47 which will be described later, and a position of the pressure chamber 31 correspond, and the ink supply port 15 is exposed upward. By joining the piezoelectric actuator 9 to the channel unit 8 in such manner, each pressure chamber 31 is covered by the actuator 9.

On an upper surface of the lowermost piezoelectric sheet 40 covering the pressure chambers 31, and the odd numbered piezoelectric sheets 41 and 43 counted from the piezoelectric sheet 40 from among the piezoelectric sheets 40 to 45, the plurality of individual electrodes 47 having a long and slender shape in a plan view with a longer side in X direction arranged corresponding separately to the position of each pressure chamber is formed by printing to overlap in a plan view corresponding to the pressure chambers 31. The individual electrodes 47 are formed in rows in Y direction of the channel unit 8, and plurality of rows in a direction (X direction) orthogonal to Y direction are arranged. Moreover, on an upper surface of the even numbered piezoelectric sheets 40, 42, and 44 counted upward from the lowermost piezoelectric sheet 40, a common electrode 48 arranged to cover substantially all the individual electrodes 47 in each row when viewed from a direction of stacking (plan view) are formed by printing. The individual electrode 47 and the common electrode 48 are arranged alternately, sandwiching at least one ceramics layer, excluding the lowermost ceramics layer 40, and the individual electrode 47 and the common electrode 48 are facing mutually.

The channel unit 8 and the actuator 9 are fixed by adhering upon arranging face-to-face each pressure chamber 31 in the channel unit 8 and each electrode 47 in the actuator 9. Out of the piezoelectric sheets 41 to 44, a portion sandwiched in a direction of stacking of the individual electrode 47 and the common electrode 48 is an energy generating portion 49. In other words, when a drive voltage is selectively applied between the individual electrode 47 and the common electrode 48 by the IC chip, an electric field acts on the energy generating portion 49 of the piezoelectric sheets 41 to 44, corresponding to the individual electrode 47 to which the drive voltage is applied, and a deformation by distortion in the direction of stacking occurs. When the energy generating portion 49 is deformed, this deformation makes the lowermost piezoelectric sheet 40 project toward inner side of the pressure chamber 31 which corresponds to the lowermost piezoelectric sheet 40. Accordingly, an internal pressure of the pressure chamber 31 rises up, and the pressure jetting the ink generates a pressure wave. The pressure wave generated is propagated to the ink inside, and the ink is jetted to an outside from the nozzle 28a through the nozzle passage 36.

Figure 4:
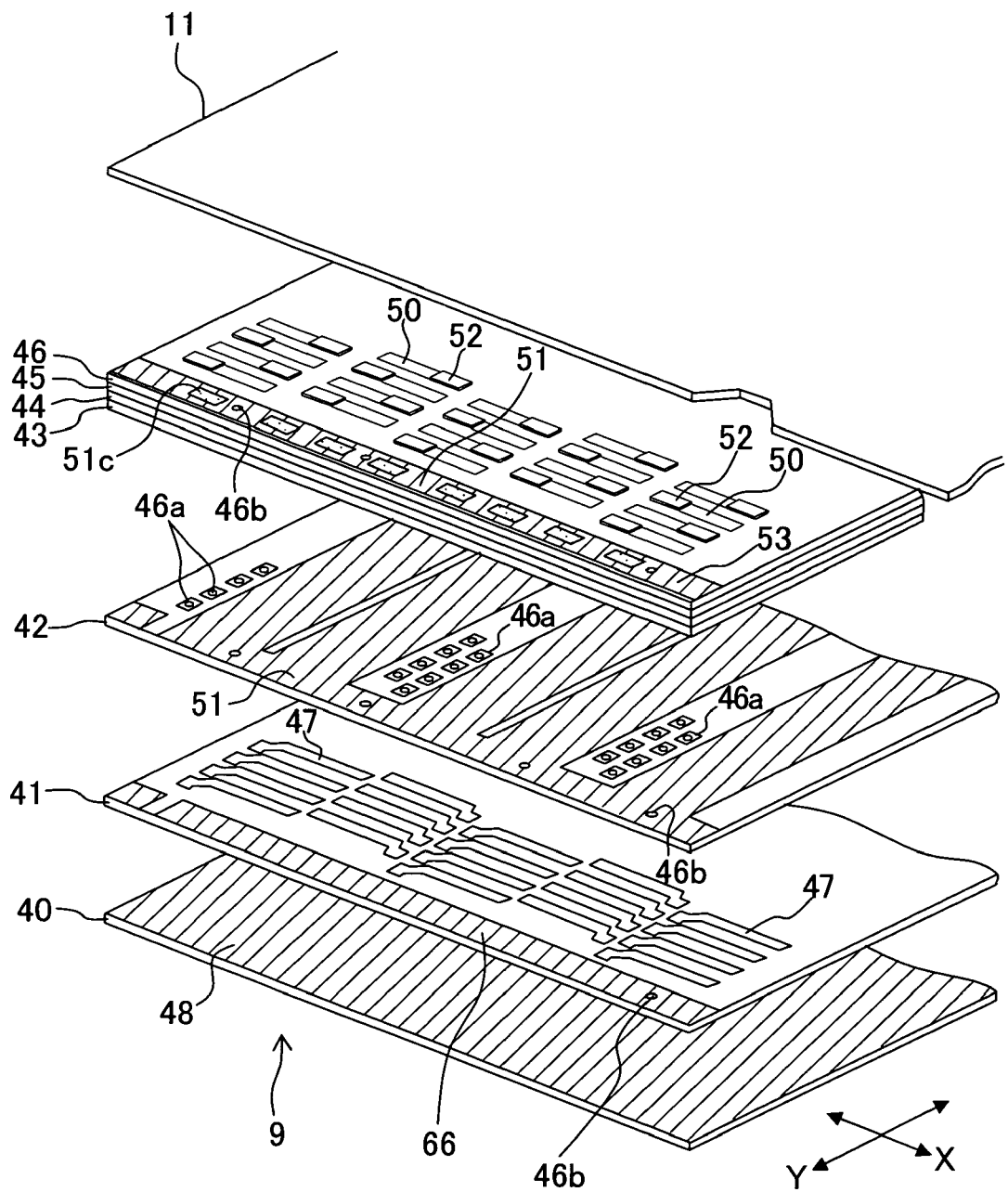
FIG. 4 is an exploded perspective view of a wiring member of an actuator of the ink-jet head shown in FIG. 2.

FIG. 4 is an exploded perspective view of a part of the actuator 9 of the ink-jet head 7 shown in FIG. 2. As shown in FIG. 4, a plurality of individual surface electrodes 50 and a common surface electrode 51 (thickness: about 0.1 μm) for bringing in electrical conduction the wiring member 11, each individual electrode 47 at an inner portion of the actuator 9, and the common electrode 48 are formed on the upper surface of the actuator 9. The individual surface electrodes 50 have a long and rectangular shape in X direction in a plan view (thickness: about 0.1 μm, length: about 1000 μm, width: about 150 μm), and are provided to overlap the pressure chambers 31. The same number of individual surface electrodes 50 as the number of pressure chambers 31 is provided in rows in X, Y direction corresponding to the pressure chambers 31, on the upper surface of the actuator 9, and a gap between the adjacent individual surface electrodes 50 is extremely narrow. The common surface electrode 51 is formed in the form of a belt along both end portions (short side) sandwiching the set of individual surface electrodes 50 on the upper surface of the actuator 9. The individual surface electrodes 50, as it will be described later, are connected individually to the energy generating portion 49 (refer to FIG. 3), and the common surface electrode 51 is connected in common to the energy generating portion 49, and is also connected to a ground.

An individual connecting terminal 52 (thickness: about 10 μm, length: about 350 μm, width: about 150 μm) having an area smaller than an area of the individual surface electrode in a plan view is provided at an end portion on the upper surface of each individual surface electrode 50. The individual connecting terminal 52 is shorter than a length of the individual surface electrode 50 in X direction, and is arranged in a staggered (zigzag) form to be formed alternately at a one end portion and the other end portion in X direction of the individual surface electrode 50 along Y direction. Moreover, a plurality of common connecting terminals 53 (thickness: about 10 μm, length: about 350 μm, width: about 150 μm) is formed at an interval on the common surface electrode 51 in the form of a belt. Each of the individual connecting terminal 52 and the common connecting terminal 53 is provided at a position corresponding to an individual electrode land 61 and a common electrode land 63 respectively, which will be described later. The connecting terminals 52 and 53 are provided to ease joining of each individual electrode land 61 and the common electrode land 63 to an electroconductive brazing filler material such as solder. The individual surface electrode 50 and the common surface electrode 51 are provided by screen printing using an Ag—Pd electroconductive material, and the individual connecting terminal 52 and the common connecting terminal 53 are formed by printing on the individual surface electrode 50 and the common surface electrode 51 using Ag-based electroconductive material including glass frit. Although it is not shown in the diagram, a positioning mark for positioning with the wiring member 11 is screen printed on the surface electrode of the actuator 9.

Figure 7:
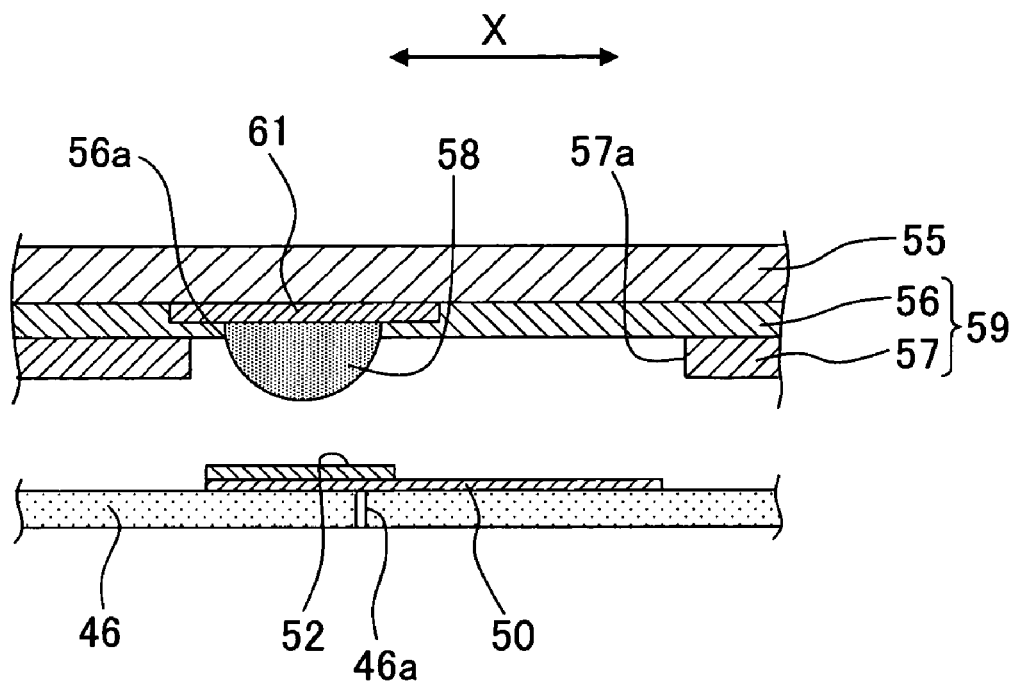
FIG. 7 is a cross-sectional view of main components before an individual electrode land of the wiring member shown in FIG. 2 is joined to an individual connecting terminal of the actuator.

Similar to a hitherto known structure described in Japanese Patent Application Laid-open No. 2005-322850, a common electrode through hole 46b having a circular cross-sectional shape, which is cut through vertically from the top sheet 46 up to the piezoelectric sheet 41 for the lowermost individual electrode as shown in FIG. 4 and FIG. 7 is formed in the actuator 9. An intermediate wire which is formed by spraying or filling an electroconductive material is provided inside the common electrode through hole 46b. The common electrode through hole 46b opens at a position at which the common surface electrode 51 on the upper surface of the piezoelectric actuator 9 is provided, and each common electrode 48 and the common surface electrode 51 lined up in the direction of stacking are brought into conduction by the intermediate wire. In order that the intermediate wire is not cut on the piezoelectric sheets 41, 43, and 45, an electroconductive material portion 66 is provided in the form of a belt on the upper surface of the piezoelectric sheets 41, 43, and 45.

Furthermore, a plurality of individual electrode through holes 46a having a circular cross-sectional shape, which are cut through vertically from the top sheet 46 up to the piezoelectric sheet 42 for the common electrode, out of the plurality of piezoelectric sheets is formed in the piezoelectric actuator 9, and are arranged in a row along Y direction as shown in FIG. 4. An intermediate wire similarly as in the common electrode through hole 46b is provided also in the individual electrode through hole 46a. The individual electrode through hole 46a opens at a position (directly under) each individual electrode terminal arranged in the staggered (zigzag) form on each individual surface electrode on the surface of the piezoelectric actuator 9, in the top sheet 46. In other words, the individual electrode through holes 46a of the top sheet 46 are formed in the staggered form in X direction.

At this time, the individual electrode through holes 46a are arranged in a row along Y direction, in the piezoelectric sheet 45 which is stacked on an immediate lower surface of the top sheet 46, and an intermediate electrode is printed on the upper surface of the piezoelectric sheet 45 to connect to the individual electrode through hole 46a formed in the staggered form in the top plate 46. In other words, the piezoelectric sheet 46 is an intermediate adjusting layer for connecting electrically the individual surface electrode 50 and the individual electrode 47. Instead of providing the common electrode around the individual electrode through hole 46*a* on the upper surface of the piezoelectric sheets 42 and 44 for the common electrode, a separate electroconductive pattern is laid in an island form, independently of the common electrode. Accordingly, the individual electrode wire is not cut, and the common electrode 51 and the individual electrode 52 are maintained in a state of bent electrically independent mutually (non electroconductive state).

The individual electrode through hole 46*a* is arranged to be opened directly under each individual connecting terminal 52 on each individual surface electrode 50. Since each individual surface electrode 50 is formed of an Ag—Pd material, when a solder 58 which is melted at the time of connecting to the individual electrode land 61 of the wiring member 11 outflows from the individual connecting terminal 52 and flows on the individual surface electrode 50, silver in the individual surface electrode 40 is diffused into the solder 58 and merged, and a so-called "silver leaching phenomenon" in which the silver on the individual surface electrode disappears occurs. As a result of this, there is a possibility that the individual surface electrode 50 breaks and is disconnected electrically. Therefore, by forming the individual electrode through hole 46*a* to be open directly under the individual connecting terminal 52 provided on the individual surface electrode 50, the breaking of wire is prohibited. Since there is no damage to the common surface electrode 51 as the common surface electrode 51 is connected to the ground, the common electrode through hole 46*b* may be brought into conduction by being opened on the common surface electrode 51, and may not be directly under the common connecting terminal 53.

At the time of forming the individual surface electrode 50 and the common surface electrode 51 by printing on the top sheet 46, and baking upon stacking the other piezoelectric sheets 40 to 45 made of ceramics layer, properties of the individual surface electrode 50 and the common surface electrode 51 change, and joining with bump of the solder 58 which will be described below is affected. Therefore, the individual connecting terminal 52 and the common connecting terminal 53 are printed additionally on the individual surface electrode 50 and the common surface electrode 51 after the actuator 9 is baked.

Figure 5:
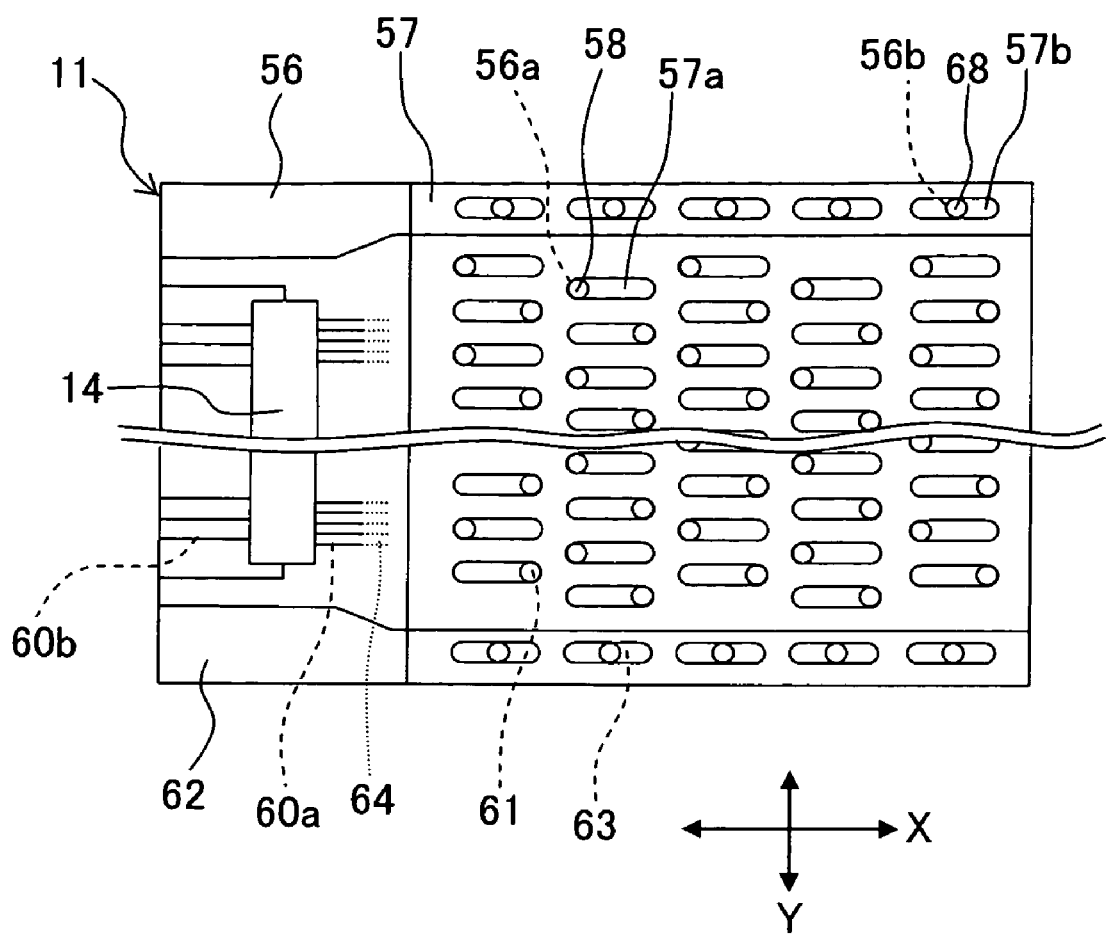
FIG. 5 is a bottom surface view of the wiring member shown in FIG. 2.
Figure 6:
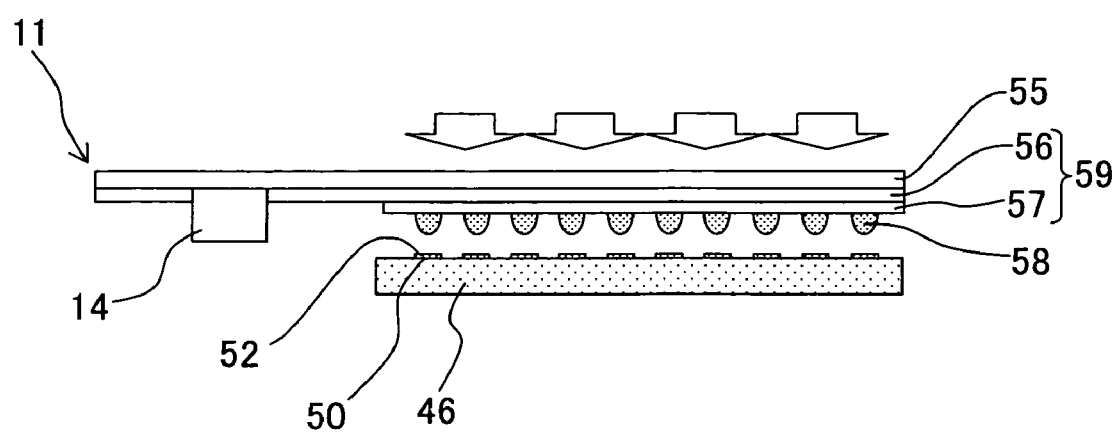
FIG. 6 is a side surface view showing joining of the wiring member shown in FIG. 2 to the actuator.
Figure 8:
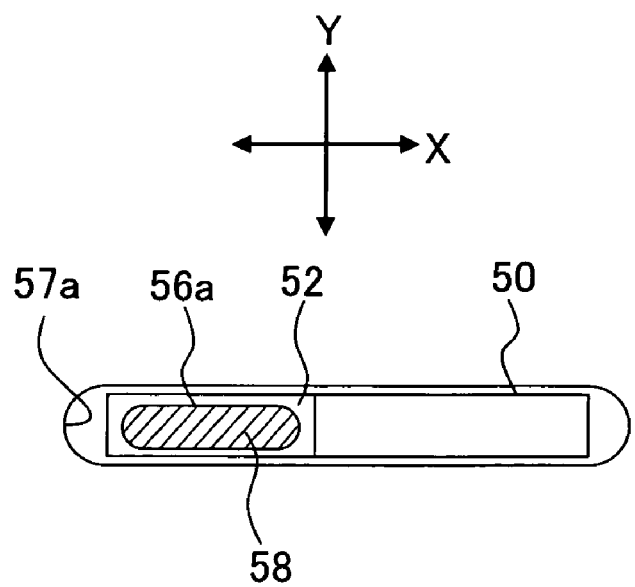
FIG. 8 is a cross-sectional view of main components before the individual electrode land of the wiring member shown in FIG. 2 is joined to the individual connecting terminal of the actuator.
Figure 9A:
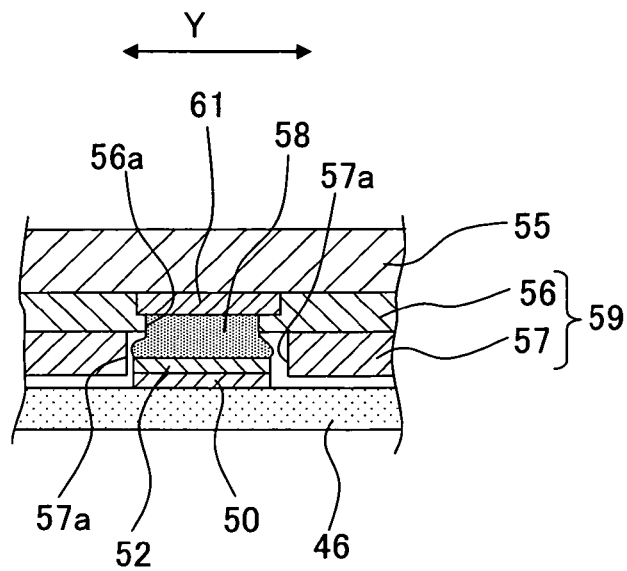
FIG. 9A is a cross-sectional view in Y direction after the individual electrode land of the wiring member shown in FIG. 2 is joined to the individual connecting terminal of the actuator.
Figure 9B:
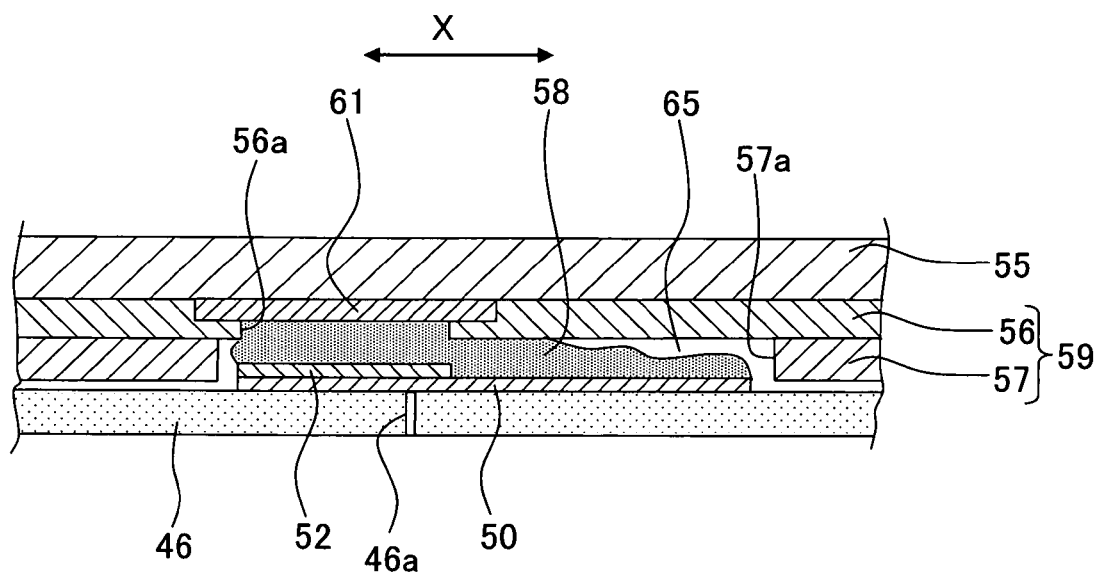
FIG. 9B is a cross-sectional view in X direction after the individual electrode land of the wiring member shown in FIG. 2 is joined to the individual connecting terminal of the actuator.

FIG. 5 is a bottom surface view of the wiring member 11 shown in FIG. 2. FIG. 6 is a side surface view describing joining of the wiring member shown in FIG. 2 to the actuator 9. FIG. 7 is a cross-sectional view of main components before the individual electrode land 61 of the wiring member 11 shown in FIG. 2 is joined to the individual connecting terminal 52 of the actuator 9. FIG. 8 is a cross-sectional view of main components before the individual electrode land 61 of the wiring member 11 shown in FIG. 2 is joined to the individual connecting terminal 52 of the actuator 9. FIG. 9A is a cross-sectional view in Y direction after the individual electrode land 61 of the wiring member 11 shown in FIG. 2 is joined to the individual connecting terminal 52 of the actuator 9, and FIG. 9B is a cross-sectional view in X direction after the individual electrode land 61 of the wiring member 11 shown in FIG. 2 is joined to the individual connecting terminal 52 of the actuator 9.

One end of the wiring member 11 is electrically connected to the upper surface of the uppermost layer of the actuator 9. The other end of the wiring member 11 is drawn in Y direction, and the IC chip 14 which has a driving circuit installed therein is mounted on the wiring member 11 in a direction in which it is drawn. A plurality of electroconductive wires 60*a* and 60*b* for transmitting a control signal from outside to and from the actuator 9 by inputting and outputting to the IC chip 14 is installed on the wiring member 11. Positioning marks not shown in the diagram are formed on the wiring member 11 and the actuator 9, and the actuator 9 is stacked and joined by positioning at the positioning mark toward the actuator 9.

As shown in FIG. 5 to FIG. 7, the wiring member 11 has a substrate 55 in the form of a flexible belt, an electroconductive wire material (wire) 64 provided on a lower surface of the substrate 55, and a covering member 59 having an insulating property, which covers the electroconductive wire material 64. The substrate 55 is made of a flexible and electrically insulating and synthetic resin material (for example, polyimide. Thickness: 38 μm). The electroconductive wire material 64 (thickness 8 μm) is formed by a plurality of electroconductive wires 60*a* and 60*b*, and a common electroconductive wire 62 made of copper foil, and the individual electrode land 61 and the common electrode land 63 are formed of a material such as photo resist. An individual input electroconductive wire 60*a* is connected to an output side of the driving IC chip 14, and the individual output electroconductive wire 60*b* is connected to an input side of the driving IC chip 14. The common electrode wire 62 is kept at a ground electric potential, and both end sides in a direction of width (Y direction) of the wiring member 11 are drawn in the form of a belt up to the other end of the wiring member 11 along the longitudinal direction (X direction).

The individual electrode land 61 and the common electrode land 63 are formed on the actuator 9, at positions corresponding to the individual connecting terminal 52 and the common connecting terminal 53. The individual electrode land 61 is arranged in a row extending in a staggered form in Y direction, and is arranged in five rows in X direction. The common electrode land 63 is arranged in the form of a row at an appropriate distance in X direction. The individual electrode land 61 is connected to the individual input electroconductive wire 60*a* and the common electrode land 63 is connected to the common electroconductive wire 62. The plurality of individual input electroconductive wires 60*a* are wired up to the driving IC chip 14 upon traveling through a distance of each individual electrode land 61, and the individual output electroconductive wire 60*b* is connected from the driving IC chip 14 up to a terminal portion at the other end of the wiring member 11.

Moreover, the covering member 59 is made of a photosensitive solder resist which is flexible and electrically insulating, and has a first covering layer 56 (thickness 15 μm) which covers substantially an entire surface of the electroconductive wire material (electroconductive wire and land) and the substrate 55, and a second covering layer 57 (thickness 15 μm) which further covers the first covering layer 56. The second covering layer 57 is formed only at a joint position facing the actuator 9, and is not formed at a portion which is drawn from a joining boundary of the actuator 9 to the other end side.

A structure and a procedure for connection related to electrical connection of the individual electrode land 61, and the individual connecting terminal 52 and the individual surface electrode 50 will be described below by using FIG. 7 to FIG. 9.

As shown in FIG. 7 and FIG. 8, a plurality of first openings 56*a* (for example, length: about 200 μm, width: about 150 μm) each having a long and slender circular shape in Y direction and exposing one of the individual electrode lands 61 is formed on the first covering layer 56. The first opening 56*a* is formed to have an area slightly smaller (a width in X direction or Y direction is small) than an area of the individual electrode land 61 in a plan view. The first covering layer 56 in the form of covering slightly both end portions in X direction of the individual electrode land 61, is provided with the bump electrode 58 of an electroconductive material such as solder on an exposed portion of the individual electrode land 61, and is joined to the individual electrode terminal 52. It is preferable that an area of an opening of the first opening 56*a* is somewhat smaller than or substantially the same as a surface area of the individual electrode terminal 52. Moreover, the first openings 56*a* are arranged in five rows in X direction, in a staggered form in Y direction, corresponding to the rows of the individual electrode land 61. The first covering layer 56 is formed between adjacent first openings 56*a* in X direction and Y direction, covering the substrate 55 continuously.

A second opening 57*a* which is open as a long and slender circular shape in X direction communicating with one of the first opening 56*a* is formed in the second covering layer 57, corresponding to the individual surface electrode 50 of the actuator 9. The second openings 57*a* are arranged in five rows in X direction, in the form of a row in Y direction, corresponding to the rows of the individual surface electrodes 50. The second covering layer 57 is formed between adjacent second openings 57*a* in X direction and Y direction, in an area facing the actuator 9, covering the first covering layer 56 continuously.

The second opening 57*a* is slightly longer in X direction and Y direction, than the individual surface electrode 50 in a plan view (refer to FIG. 8) (for example, length: 1050 µm, width: 200 µm). When the wiring member 11 is stacked on the actuator 9 by corresponding each individual surface electrode 50 with each individual electrode land 61, a circumferential portion of the second opening 57*a* becomes a wall portion which surrounds the individual surface electrode 50. Moreover, a circumference of the opening of the second opening 57*a* is formed to be greater than a circumference of the opening of the first opening 56*a*. Furthermore, when viewed in a direction of stacking (in a plan view), the area of the individual surface electrode 50 (area of a surface facing the wiring member 11) is larger than an area exposed of the individual electrode land 61 (area of opening of the first opening 56*a*).

Concretely, the individual electrode land 61 is provided on the individual surface electrode 50, at a position overlapping with the individual surface electrode 50 arranged at one end side or the other end side in X direction, and the individual surface electrode 50 is arranged to be projected partially toward an outside (toward X direction) of the individual electrode land 61 when viewed from the stacking direction of the individual surface electrode 50. Therefore, the first opening 56*a* is formed to be inclined toward one end side (or the other end side) of the second opening 57*a* which is formed to be slightly long and slender in X direction than the individual surface electrode 50 in a plan view. A length in a long axis direction (X direction) of the second opening 57*a* is about 1.5 times to 3 times of a length in a long axis direction (X direction) of the first opening 56*a*. Moreover, the through hole 46*a* is formed in the top sheet 46 of the actuator 9, at a lower side of the individual surface electrode 50. The through hole 46*a* opens directly under the individual connecting terminal 52 which is provided at one end portion of the individual surface electrode 50.

As shown in FIG. 9A and FIG. 9B, the wiring member 11 and the actuator 9 are stacked in a state in which, the individual electrode land 61 on which the bump electrode of the solder 58 is arranged is positioned to be facing the individual connecting terminal 52. Moreover, by pressurizing and heating by a bar heater from an upper side of the wiring member 11, the solder 58 is melted, and the individual electrode land 61 and the individual connecting terminal 52 are connected by the solder 58. In other words, the individual electrode land 61 and the individual connecting terminal 52 on the individual surface electrode 50 are connected to be in electrical conduction by cooling and hardening the solder 58 melted through the first opening 56*a* and the second opening 57*a*, and become round due to a surface tension, in a state that the solder 58 is interposed between the individual electrode land 61 and the individual connecting terminal 52. The individual connecting terminal 52 being formed of a silver-based electrode including glass frit, has a favorable wettability with solder, and high joining strength. Therefore, it is possible to connect the individual electrode land 61 and the individual surface electrode 50 electrically and mechanically via solder.

Moreover, when the wiring member 11 is stacked on the actuator 9, by corresponding each individual connecting terminal 52 and each individual electrode land 61 as described above, the second opening 57*a*, is formed to be greater than a circumference of the opening of the first opening 56*a*, and the circumferential portion of the second opening 57*a* becomes a wall portion surrounding the individual surface electrode 50. Therefore, even when an excessive amount of the melted solder 58 overflows from a gap between the individual connecting terminal 52 and the individual electrode land 61, it can spread up to the other end portion on a side opposite to the individual connecting terminal 52 out of the circumference of opening of the second opening 57*a*, along a direction of extension (X direction) from one end portion in X direction on the individual surface electrode 50 on which the individual connecting terminal 52 is arranged. In other words, the excessive solder 58 is surrounded by the second opening 57*a* which becomes the wall portion. At this time, a volume of a space defined by the first opening 56*a*, the second opening 57*a*, the individual surface electrode 50, the individual connecting terminal 52, and the individual electrode land 61 further includes an additional space 65 in addition to a volume occupied by the solder 58 which has escaped.

In the embodiment, the second opening 57*a* has a length and a width (dimensions in X and Y direction) more than a length and a width of the individual surface electrode 50. Accordingly, when the flexible wiring member and the actuator are stacked, even if there is a slight position shift of the individual connecting terminal 52 and the individual electrode land 61, it is possible to connect the individual connecting terminal 52 and the individual electrode land 61 by solder. In this case, as it is shown in FIG. 9A and FIG. 9B, since the solder is hardened by cooling in a state of being held on the connecting terminal or the surface electrode by the surface tension thereof, the solder does not flow out from the connecting electrode and the surface electrode in a range of that surface tension (when the solder flows out from the connecting terminal, it flows actively to the surface electrode in Y direction).

When the circumference of the second opening 57*a* is greater than the circumference of the first opening 56*a*, and when the second opening 57*a* is open corresponding to the surface electrode, and has an excessive portion, it is possible to make an appropriate change in the length and the width of the surface electrode. An arrangement may be made such that the excessive solder flows to the individual surface electrode in X direction. For instance, a dimension in a direction of width of the second opening 57*a* may be let to be slightly smaller than a dimension of width of the surface electrode. In this case, when the solder is substantial, or when there is a variation in heating and pressing, by letting the excessive solder escape in X direction, it is possible to prevent the excessive solder from flowing beyond the surface tension to a direction of the adjacent electrode in Y direction.

Figure 11:
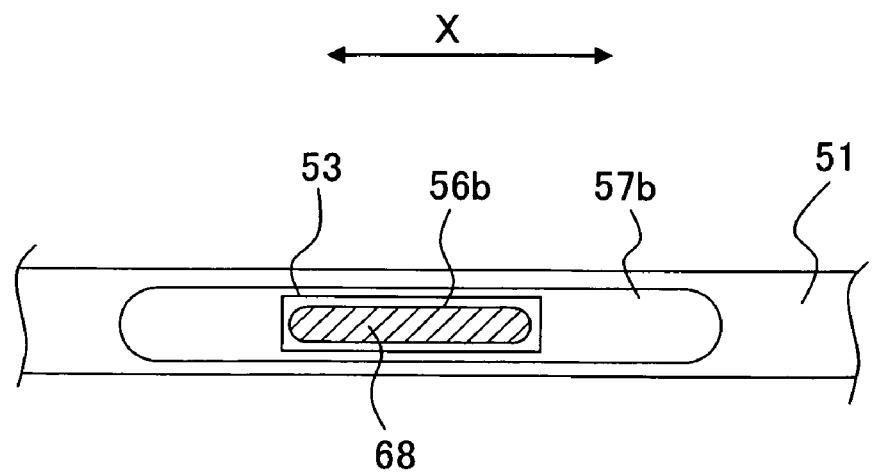
FIG. 11 is a cross-sectional view of main components before the common electrode land of the wiring member shown in FIG. 2 is joined to the common connecting terminal of the actuator.
Figure 12:
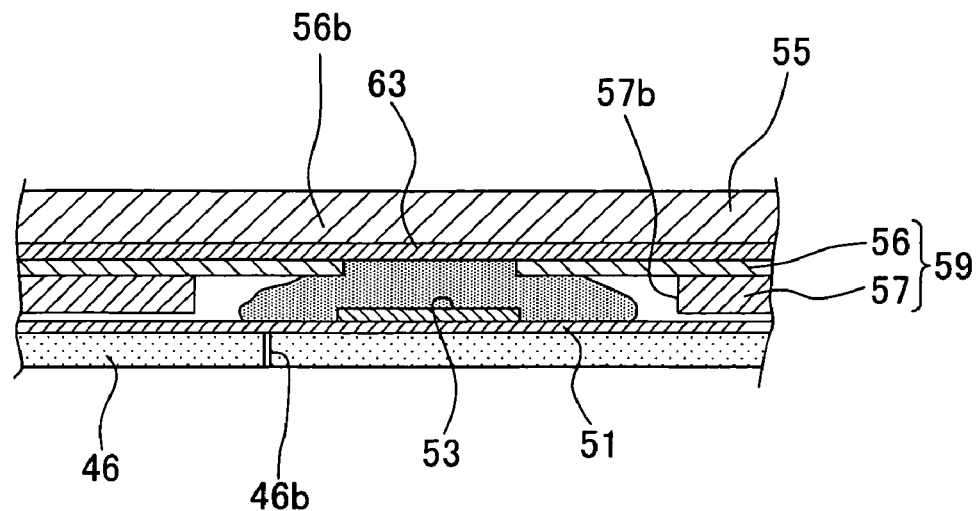
FIG. 12 is a cross-sectional view of main components after the common electrode land of the wiring member shown in FIG. 2 is joined to the common connecting terminal of the actuator.

Next, a structure and a procedure for connection related to electrical connection of the common electrode land 63, and the common connecting terminal 53 and the common surface electrode 51 will be described below by using FIG. 10 to FIG. 12.

Figure 10:
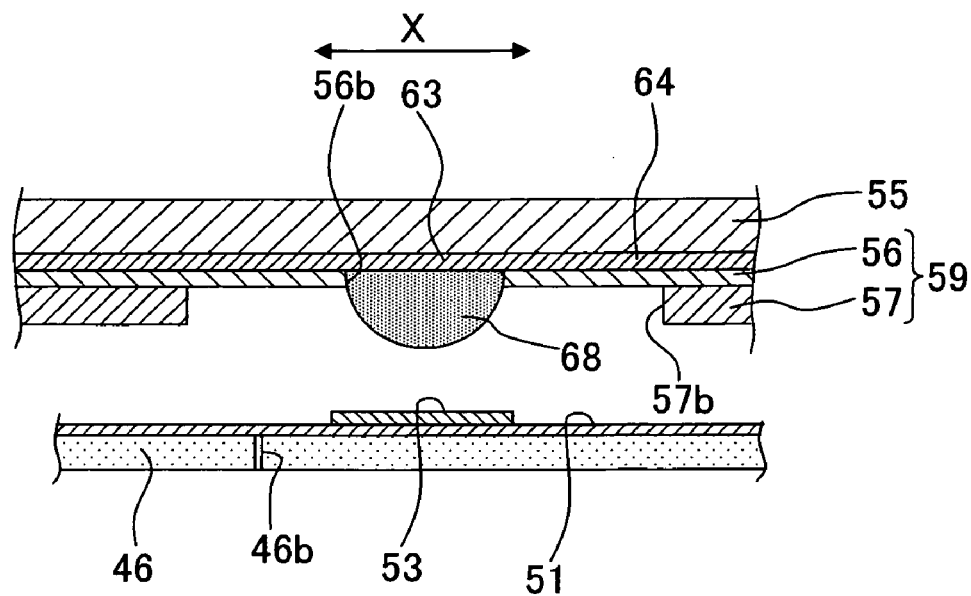
FIG. 10 is a cross-sectional view of main components before a common electrode land of the wiring member shown in FIG. 2 is joined to a common connecting terminal of the actuator.

FIG. 10 is a cross-sectional view of main components before the common electrode land 63 of the wiring member 11 shown in FIG. 2 is joined to the common electrode terminal 53 of the actuator 9. FIG. 11 is a cross-sectional view of main components before the common electrode land 63 of the wiring member 11 shown in FIG. 2 is joined to the common connecting terminal 53 of the actuator 9. FIG. 12 is a cross-sectional view of the main components after the common electrode land 63 of the wiring member 11 shown in FIG. 2 is joined to the common connecting terminal 53 of the actuator 9. As shown in FIG. 10 and FIG. 11, a plurality of first openings 56b each having a long and slender circular shape in Y direction and exposing one of the individual electrode lands 63 therein is formed on the first covering layer 56. The common electrode land 63 is formed corresponding to a position overlapping with the common electrode terminal 53 of the actuator 9. The common electrode lands 63 are arranged at an appropriate interval (distance) in X direction. The common electrode land 63 is a part of the electroconductive wire member 64 exposed through the first opening 56b of the first covering layer 56, and the first opening 56b is formed to have an area slightly smaller than the common electrode terminal 53 in a plan view (a dimension of width in X, Y direction is smaller). A bump electrode 68 is provided on the common electrode land 63 which is the exposed portion, and is connected to the common electrode terminal 53. The first covering layer 56 is formed to cover the substrate 55 continuously between adjacent first openings 56b among the first openings 56b.

A plurality of second openings 57b each having a long and slender circular shape in Y direction and communicating with one of the first openings 56b is formed on the second covering layer 57, corresponding to the common surface electrode 51. The second covering layer 57 is formed between adjacent second openings 57b in X direction, covering the first covering layer 56 continuously. A circumference of the second opening 57b is formed to be greater than a circumference of the first opening 56b, and the first opening 56b is arranged at a substantial center of the second opening 57b. The second opening 57b corresponding to the common electrode land 63 has a substantially same shape and a substantially same area of opening as of the second opening 57a corresponding to the individual electrode land 61 (for example, length: 1050 µm, width: 200 µm). The first opening 56b corresponding to the common electrode land 63 has a substantially same shape and a substantially same area of opening as of the first opening 56a corresponding to the individual electrode land 61 (for example, length: about 200 µm, width: about 150 µm).

When the wiring member 11 is stacked on the actuator 9 by making the common connecting terminal 53 correspond with the common electrode land 63, a circumferential portion (both ends in a cross-sectional view in X direction. Refer to FIG. 12) of the second opening 57b becomes a wall portion surrounding the common connecting terminal 53. An area surrounded by the circumferential portion of the second opening 57b, out of the area of the common surface electrode 51 facing the wiring member 11, is in a state of being projected at an equal interval toward an outside (toward X direction) of the common electrode land 63 in a plan view, and this area surrounded by the wall portion becomes an escape area for the solder, which will be described later. A length in a long axis direction of the second opening 57b is about 1.5 times to 3 times of a length in a long axis direction (X direction) of the first opening 56b.

As shown in FIG. 10, the wiring member 11 and the actuator 9 are stacked upon positioning such that the common connecting terminal 53 and the common electrode land 63 on which the bump electrode of the solder 68 is arranged correspond, and by pressurizing and heating from the upper side of the wiring member 11, the solder is melted, and the common electrode land 63 and the common connecting terminal 53 are connected by the solder 68. In other words, the common electrode land 63 and the common connecting terminal 53 on the common surface electrode 51 are connected to be in electrical conduction with the solder 68 interposed between the common electrode land 63 and the common connecting terminal 53 through the first opening 56b and the second opening 57b. The common connecting terminal 53, similar to the individual connecting terminal 52, is also formed of a silver-based electrode including glass frit, and it is possible to connect mechanically and electrically with the solder 68.

The second opening 57b becomes the wall portion as described above. Therefore, even when the excessive amount of the melted solder 68 flows out from the gap between the common connecting terminal 53 and the common electrode land 63, it can spread to escape in an area surrounded by the peripheral portion of the second opening 57b, on the common surface electrode 51 on which the common connecting terminal 53 is arranged, along a direction of extension thereof (X direction). In other words, the excessive solder 68 is surrounded by both end portions in a plan view of the second opening 57b which becomes the wall portion of the circumferential portion of the excessive solder 68. At this time, a volume of a space defined by the first opening 56b, the second opening 57b, the common surface electrode 5, the common connecting terminal 53, and the common electrode land 63 further includes an additional space 69 in addition to a volume occupied by the solder 68 which has escaped.

Figure 13:
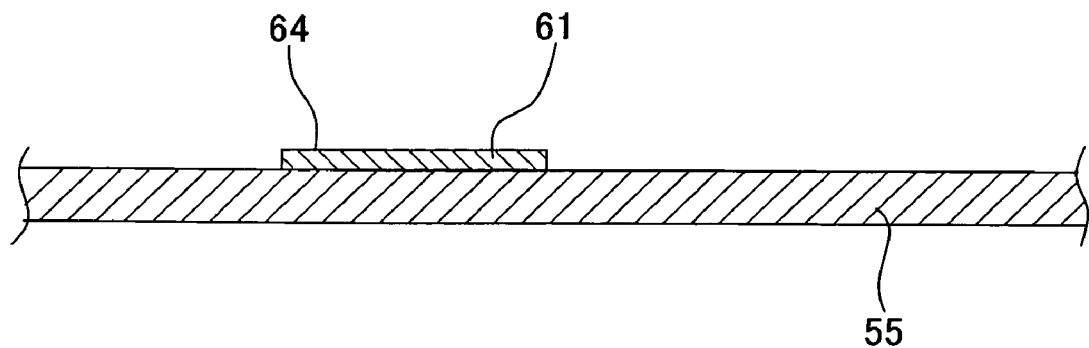
FIG. 13 is a cross-sectional view describing a first step at the time of manufacturing the ink-jet printer shown in FIG. 1.
Figure 14:
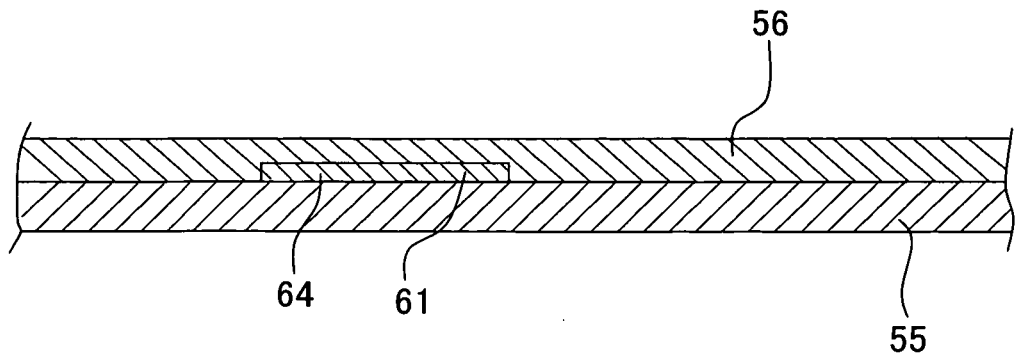
FIG. 14 is a cross-sectional view describing a second step at the time of manufacturing the ink-jet printer shown in FIG. 1.

Next, a procedure for manufacturing the wiring member 11 and the actuator 9 of the ink-jet printer 1 will be described below. Since a portion corresponding to the individual electrode land 61 and a portion corresponding to the common electrode land 63 have same type of manufacturing procedure, the description will be made below by concentrating on the individual electrode land 61 as a typical example. Diagrams from FIG. 13 to FIG. 20 are cross-sectional views describing steps from a first step to an eighth step at the time of manufacturing the ink-jet printer 1 shown in FIG. 1. As shown in FIG. 13, firstly, a surface which is the lower surface (side facing the actuator 9) of the substrate 55 in the form of a belt, made of polyimide is directed upward, and electroconductive wire materials 60a and 60b (refer to FIG. 5) of a predetermined pattern including the individual electrode land 61 are formed by printing on the lower surface of the substrate 55. At this time, the common electrode land 63 and the common electroconductive wire 56 are also formed by printing simultaneously. Next, as shown in FIG. 14, the first covering layer 56 which is a negative photoresist is formed to cover the substrate 55 and the electroconductive wire material 64. The first covering layer 56 is formed to cover an entire area of the substrate 55.

Figure 15:
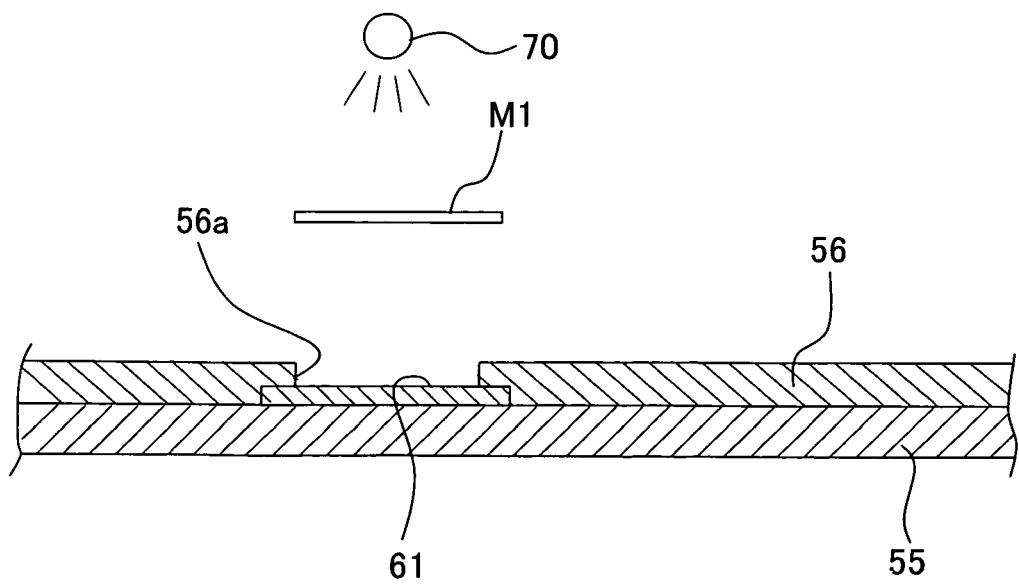
FIG. 15 is a cross-sectional view describing a third step at the time of manufacturing the ink-jet printer shown in FIG. 1.

Next, as shown in FIG. 15, with a mask M1 which covers an area slightly smaller than the individual electrode land 61, light is irradiated from an upper side on the first covering layer 56 from a light emitting source 70. Thereafter, by using a developer, a portion of the first covering layer 56 which is not exposed to light is removed by dissolving, and only an exposed portion of the first covering layer 56 is let to remain.

Accordingly, the first opening 56*a* which exposes the individual electrode land 61 is formed. Moreover, the first opening 56*b* which exposes the common electrode land 63 is also formed simultaneously.

Figure 16:
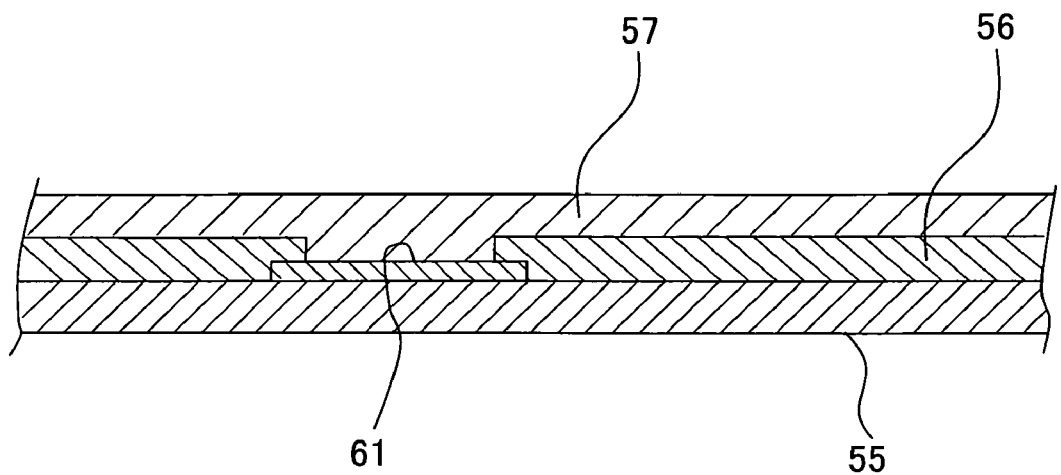
FIG. 16 is a cross-sectional view describing a fourth step at the time of manufacturing the ink-jet printer shown in FIG. 1.
Figure 17:
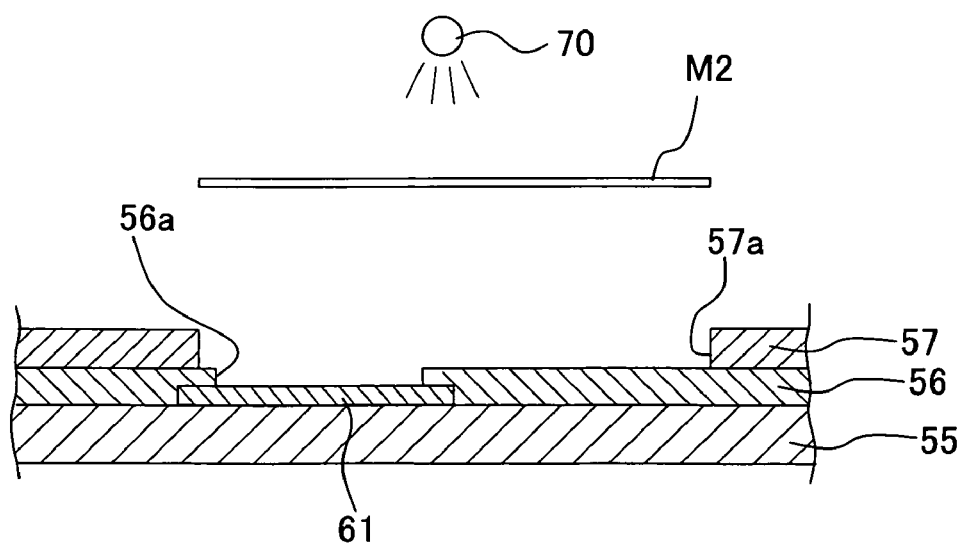
FIG. 17 is a cross-sectional view describing a fifth step at the time of manufacturing the ink-jet printer shown in FIG. 1.

Next, as shown in FIG. 16, the second covering layer 57 which is a negative photoresist is formed to cover the exposed portion of the first covering layer 56 and the individual electrode land 61. The second covering layer 57 may be formed to be covering an area facing the actuator 9. Next, as shown in FIG. 17, light is irradiated from an upper side of the second covering layer 57 from the light emitting source 70 via a mask M2 which covers an area larger than the first opening 56*a*. Thereafter, by using a developer, a portion of the second covering layer 57 which is not exposed to light is removed by dissolving, and only an exposed portion of the second covering layer 57 is let to remain. Accordingly, the second opening 57*a* which exposes the individual electrode land 61 and the first covering layer 56 surrounding the individual electrode land 61, and which communicates with the first opening 56*a* is formed. Moreover, the second opening 57*b* which communicates with the first opening 56*b* of the common electrode land 63 is also formed simultaneously.

Figure 18:
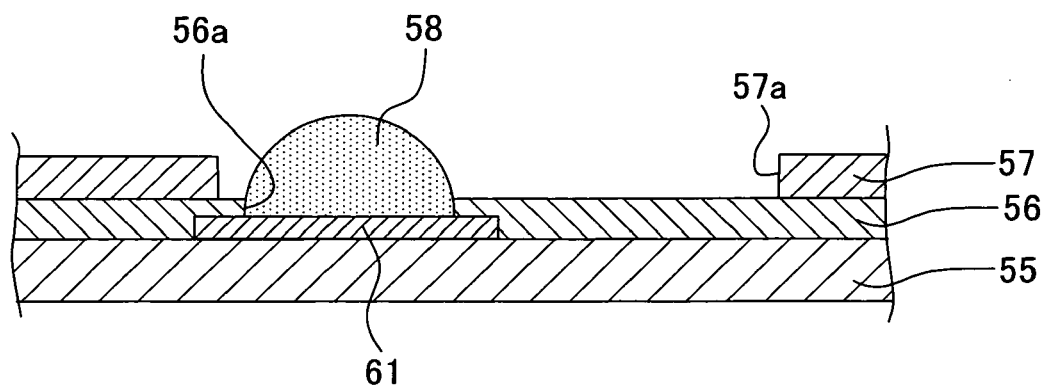
FIG. 18 is a cross-sectional view describing a sixth step at the time of manufacturing the ink-jet printer shown in FIG. 1.
Figure 19:
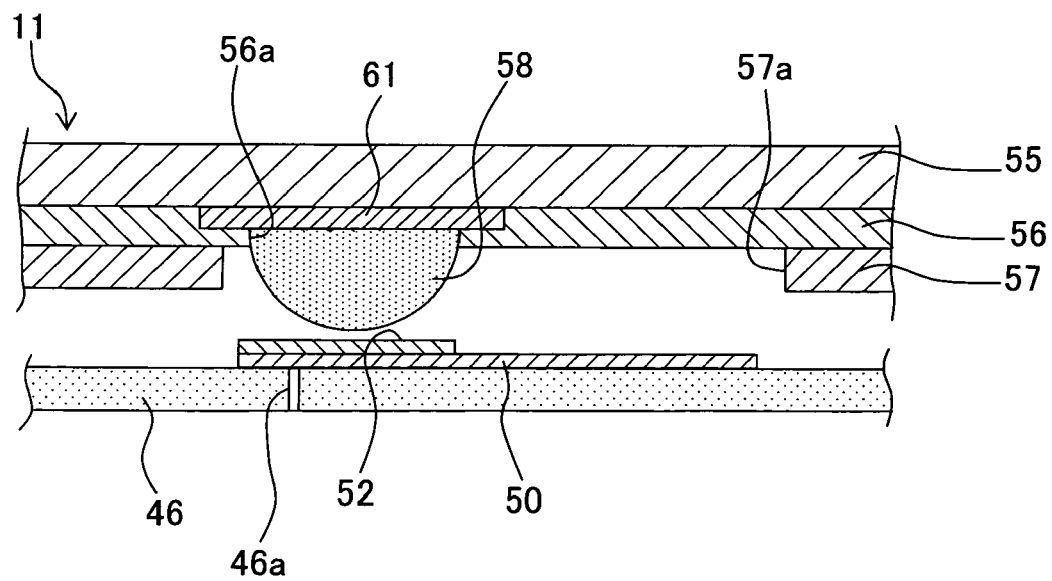
FIG. 19 is a cross-sectional view describing a seventh step at the time of manufacturing the ink-jet printer shown in FIG. 1.

Next, as shown in FIG. 18, a bump of the solder 58 is arranged on an exposed portion of the common electrode land 61 in the first opening 56*a*. It is possible to form the bump electrode 58 by hardening by cooling in a reflow step after mask printing a bump paste at a bump position (exposed portion). A bump is formed simultaneously also on the common electrode land which is exposed through the first opening 56*b*. Next, as shown in FIG. 19, the lower surface of the wiring member 11 is directed downward, and the individual electrode land 61 is made to face the individual connecting terminal 52 of the actuator 9 via the bump of the solder 58. Further, the wiring member 11 is positioned at a positioning mark which is not shown in the diagram, and stacked on the top sheet 46 of the actuator 9.

Figure 20:
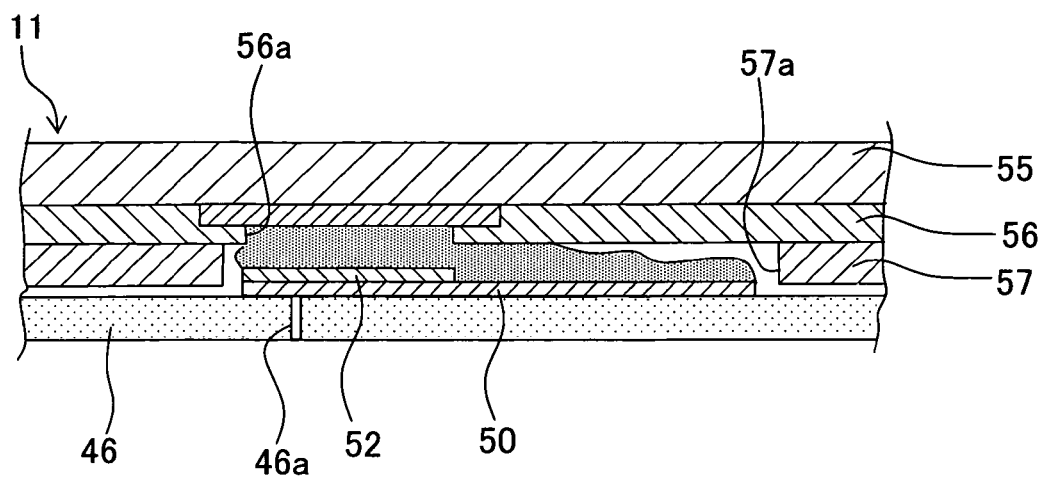
FIG. 20 is a cross-sectional view describing an eighth step at the time of manufacturing the ink-jet printer shown in FIG. 1.

Next, as shown in FIG. 20, by pressurizing and heating by a bar heater from the upper side of the wiring member 11, toward the top sheet 46 of the actuator 9, the solder is melted, and the individual connecting terminal 52 and the individual surface electrode 50, and the individual electrode land 61 are connected by interposing the solder 58 therebetween. At this time, by pressurizing and heating by the bar heater, a variation in a distance between the electrodes due to curling of the wiring member 11 and unevenness of the actuator 9 is absorbed by a variation in a height of the solder which is melted. In other words, even when the excessive amount of the melted solder 58 flows out from the gap between the individual connecting terminal 52 and the individual electrode land 61, it spreads up to an end portion on a side opposite to the individual connecting terminal 52 out of the circumference of the opening of the second opening 57*a*, along the direction of length (X direction) on the individual surface electrode 50, from the individual connecting terminal, and is hardened by cooling in a state of being surrounded by the circumferential portion (wall portion) of the second opening 57*a*. At this time, the common connecting terminal 53, the common surface electrode 51, and the common electrode land 63 are connected by interposing the solder in between. The excessive amount of solder 58 which has come out spreads to escape from the common connecting terminal 53 up to the circumference of the opening of the second opening on the common surface electrode 51, along X direction, and is hardened by cooling in a state of being surrounded by the circumferential portion (wall portion) of the second opening 57*b*. The wall portion is also capable of preventing the solder which flows out from a gap between the adjacent surface electrodes.

According to the abovementioned description, since an area of the surface of the individual surface electrode 50 facing the individual electrode land 61 is greater than an exposed area of the individual electrode land 61 in a plan view, and the individual surface electrode 50 is projected partially toward outside (toward X direction) of the individual electrode land 61, even when the amount of the solder 58 provided on the individual electrode land 61 is large, the excessive amount of the solder 58 which has come out from the gap between the individual connecting terminal 52 and the individual electrode land 61 spreads along a direction of length (X direction) from an end portion of the individual surface electrode 50, on which the individual connecting terminal 52 is provided, up to an end portion on an opposite side thereof. Furthermore, the second opening 57*a* opens to face the individual surface electrode 50, and the circumference of the second opening 57*a* is greater than the circumference of the first opening 56*a*. Therefore, the second opening 57*a* defines a solder space along the individual surface electrode 50, which is greater than the individual electrode land 61, and the second covering layer 57 becomes a wall portion of the solder space, and it is possible to prevent an outflow of the melted solder 58 in this space. Since a volume of a space defined by the first openings 56*a* and 56*b* and the second openings 57*a* and 57*b* includes the additional spaces 65 and 69 in addition to a volume occupied by the solders 58 and 68, even when a pressure exerted on the actuator 9 of the wiring member 11 is substantial and the amount solder is substantial, the melted solders 58 and 68 are accommodated in the excess spaces 65 and 69, and the excess solder is prevented from being leaked to outside. Consequently, in solder connections of the plurality of lands arranged highly densely in a limited space, and the plurality of surface electrodes, it is possible to control a variation in connections, and to prevent appropriately the melted solder 58 from getting shorted with adjacent individual surface electrodes 50 of a narrow width.

Moreover, the excessive amount of the solder 58 which has come out from the gap between the individual connecting terminal 53 and the individual electrode land 61 spreads along the individual surface electrode 50 having an exposed area greater than the exposed area of the individual electrode land 61. Therefore, the individual connecting terminal 52 and the individual electrode land 61 are not only connected electrically and mechanically, but an area of joining between the solder 58 which is spread and the individual surface electrode 50 is also secured sufficiently, and it is possible to contribute to an improvement in a joining strength.

Furthermore, since the individual electrode land 61 is arranged in a row in the zigzag form, even while arranging a large number of the individual electrode lands 61 in a plurality of rows, it is possible to secure a wide distance between adjacent individual electrode lands 61. Accordingly, it is possible to wire the individual electroconductive wires 60 in the wiring member 11 easily, through the gap between the individual electrode lands 61, and it is possible to facilitate a high densification.

Moreover, the plurality of common connecting terminals 53 is provided on the common surface electrode 51, and all the common connecting terminals 53 are kept at the ground electric potential. Therefore, even when the common connecting terminals 53 get shorted, there is no problem. However, in the embodiment, an area of the second opening 57*b* corresponding to the common electrode land 63 is formed to be substantially the same as an area of the second opening 57*a* corresponding to the individual electrode land 61. Accordingly, a shape (height and spreading) of the solders 58 and 68 between the common electrode land 63 and the individual electrode land 61 becomes uniform, and the connection between the actuator 9 and the wiring member 11 as a whole is stabilized.

Furthermore, since the first covering layer 56 is not missing between adjacent first openings 56a and 56b, and the second covering layer 57 is not missing between adjacent second openings 57a and 57b, the strength of the wiring member 11 improves. Therefore, it is possible to prevent the cross-talk phenomenon in which an energy of the energy generating portion 49 corresponding to a certain first opening 56a and second opening 57a is transmitted via the wiring member 11, to the energy generating portion 49 corresponding to the adjacent first opening 56a and the second opening 57a.

By making large number of channels and high densification of the ink-jet head, a solder space (connection area) of the connecting electrodes and the lands become small. Accordingly, even if it is difficult to control the heating and pressurizing and a variation in the amount of solder, in the embodiment, the area of the electrode is greater than the area of the land, and the solder interposed between the land and the electrode and the solder overflowing from there is spread on the surface of the electrode, and the land and the electrode are connected. Therefore, by correcting the variation in the connection as described above, the electrical and mechanical connection becomes firm. Moreover, when the wiring member 11 is connected while the second opening is formed facing the surface electrode, it becomes the wall portion of the solder which overflows. Therefore, it is possible to prevent adjacent surface electrodes having a narrow width from being shorted.

Figure 21:
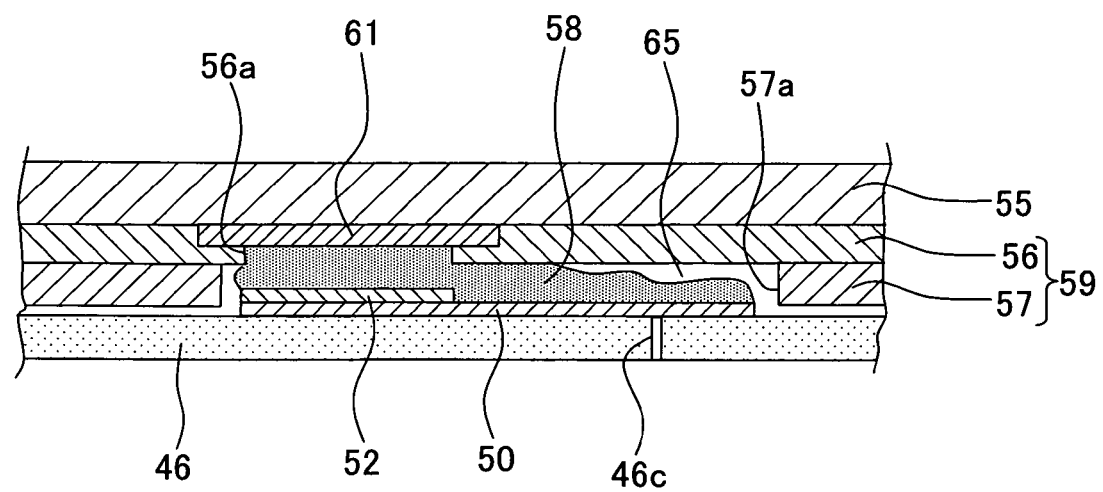
FIG. 21 is a cross-sectional view describing a modified example of a through hole of an actuator.

FIG. 21 is a cross-sectional view showing a modified example of a through hole of an actuator. As shown in FIG. 21, an individual electrode through hole 46c may open directly under the individual connecting terminal 52, on the upper surface of the individual surface electrode 50. As in this modified example, even when the individual electrode through hole 46a is not directly under the individual connecting terminal 51 (let to be the other end side of the individual surface electrode), the solder 58 which is melted spreads actively up to an end portion at the other end side of the individual surface electrode 50. Therefore, even when the individual surface electrode 50 breaks due to the "silver leaching phenomenon", since the solder 58 is spread on the individual surface electrode 50, and connected to the individual electrode through hole 46a, it is possible to facilitate preventing an electrical wire break. Therefore, even when the individual electrode intermediate layer sheet 45 of the actuator as shown in FIG. 4 is not arranged, it is possible to connect electrically the individual electrode 47 inside each of the piezoelectric sheets 40 to 46, and the individual surface electrode 50 of the actuator, and to facilitate a cost reduction and a size reduction. Moreover, with the individual electrode land 61 arranged of the wiring member 11 in the staggered form as it has been, it is possible to connect to the actuator even upon eliminating the adjusting layer. Therefore, it is also possible to realize a highly densified wiring of the wiring member 11.

In the abovementioned embodiment, the individual connecting terminal 52 and the common connecting terminal 53 are provided. However, without providing the individual connecting terminal 52 and the common connecting terminal 53, the individual electrode land 61 and the common electrode land 63 may be connected directly to the individual surface electrode 50 and the common surface electrode 51 by the solders 58 and 68. Moreover, the actuator 9 of the abovementioned embodiment is of the piezoelectric driving type. However, the actuator 9 is not restricted to the piezoelectric type, provided that the actuator 9 is capable of applying the jetting energy to the ink. Moreover, in the embodiment, a case in which solder is used as the electroconductive material is described. However, the electroconductive material is not restricted to solder, and an anisotropic conductive paste (ACP) in which particles of an electroconductive material such as nickel are dispersed in a binder made of a thermosetting resin may be used. Furthermore, the first openings 56a and 56b, and the second openings 57a and 57b are formed by using the negative photoresist. However, a positive photoresist may also be used. Moreover, in the abovementioned embodiment, the present invention is applied to an ink-jet printer. However, the present invention may be applicable to a liquid droplet jetting apparatus which is used in apparatuses such as an apparatus which manufactures a color filter of a liquid-crystal display unit by jetting a liquid other than ink such as a colored liquid, and an apparatus which forms electrical wiring by jetting an electroconductive liquid other than ink.

What is claimed is:

1. A liquid droplet jetting apparatus which jets droplets of liquid, comprising:
   a liquid droplet jetting head which jets liquid droplets when an actuator having a plurality of energy generating portions is driven; and
   a wiring member via which a drive signal is outputted to a surface electrode formed in the actuator, the wiring member including an insulative substrate, a wire provided on one surface of the substrate, and a covering member having an insulating property and covering the wire, the wire having an electrode land which is stacked on the surface electrode to be connected to the surface electrode, the covering member having a first covering layer in which a first opening to expose the electrode land therein is formed and a second covering layer having a second opening communicating with the first opening and covering the first covering layer,
   wherein the second opening is formed so as to face the surface electrode; a circumference of the second opening is greater than a circumference of the first opening; an area of the surface electrode is greater than an exposure area of the electrode land; the surface electrode is projected partially toward an outside of the electrode land; and the surface electrode and the electrode land are connected in a state that an electroconductive material is interposed between the surface electrode and the electrode land through the first opening and the second opening.

2. The liquid droplet jetting apparatus according to claim 1, wherein the electroconductive material is solder.

3. The liquid droplet jetting apparatus according to claim 2, wherein a volume of a space defined by the first opening and the second opening includes an additional space other than a volume occupied by the solder.

4. The liquid droplet jetting apparatus according to claim 2, wherein a connecting terminal having an area smaller than the area of the surface electrode is provided on a surface of the surface electrode, at a portion facing the electrode land; the electrode land is connected with the connecting terminal via the solder to be conducted with the surface electrode; a portion, of the solder, outflowing from a surface of the connecting terminal is spread on the surface electrode, and the second opening surrounds the spread solder.

5. The liquid droplet jetting apparatus according to claim 4, wherein the solder is interposed between the connecting terminal and the electrode land through the first opening and the second opening; and a portion of the solder is overflowed from a gap between the connecting terminal and the electrode land and is spread up to the partially projected area of the surface electrode.

6. The liquid droplet jetting apparatus according to claim 5, wherein the surface electrode is provided as a plurality of individual surface electrodes and a common surface electrode which is connected in common to the energy generating portions, each of the individual surface electrodes extending in a predetermined direction in a form of a belt and being connected to one of the energy generating portions, the individual surface electrodes being arranged in the predetermined direction to form a plurality of individual surface electrode-rows which are arranged in a direction orthogonal to the predetermined direction;

the electrode land is provided as a plurality of individual electrode lands each corresponding to one of the individual surface electrodes and a common electrode land corresponding to the common surface electrode;

the connecting terminal is provided as a plurality of individual connecting terminals each of which is provided at a portion of a surface, of one of the individual surface electrodes, facing one of the individual electrode lands, and a common connecting terminal provided at a portion of a surface, of the common surface electrode, facing the common electrode land;

each of the individual connecting terminals is shorter than one of the individual surface electrodes;

the individual connecting terminals are arranged alternately in a direction orthogonal to the predetermined direction alternately at one end portion and the other end portion in a longitudinal direction of the individual surface electrodes;

the individual electrode lands are arranged in a plurality of individual electrode land-rows corresponding to the individual connecting terminals, and the wire is provided as a plurality of wires wired through gaps between the individual electrode lands; and the portion of the solder outflowed from one of the individual connecting terminals is spread inside the circumference of the second opening.

7. The liquid droplet jetting apparatus according to claim 6, wherein the common surface electrode is formed on the surface of the actuator on both sides with the individual surface electrodes sandwiched therebetween; a plurality of common connecting terminals are provided on the common surface electrode at an interval; and the second opening facing the common electrode land is open to have an opening area substantially same as that of the second opening facing the individual electrode lands.

8. The liquid droplet jetting apparatus according to claim 1, wherein the first opening is formed as a plurality of first openings and the first covering layer continuously covers the substrate between adjacent first openings among the plurality of first openings.

9. The liquid droplet jetting apparatus according to claim 8, wherein the second opening is formed as a plurality of second openings and the second covering layer continuously covers the first covering layer between adjacent second openings among the plurality of second openings, at an area of the second covering layer facing the actuator.

10. A method for manufacturing liquid droplet jetting apparatus including a liquid droplet jetting head which jets liquid droplets when an actuator having a plurality of energy generating portions is driven, and a wiring member which outputs a drive signal to a plurality of surface electrodes of the actuator, the method comprising:

arranging a plurality of wires on a surface of a substrate of the wiring member;

forming, on the substrate, a first covering layer having a plurality of first openings via which a plurality of electrode lands, of the wires, are exposed respectively;

forming, on the first covering layer, a second covering layer having a plurality of second openings which communicate with the first openings respectively and are facing the surface electrodes respectively, each of the second openings having a circumference greater than a circumference of one of the first openings;

arranging a bump of an electroconductive material on each of the electrode lands in each of the first openings;

stacking the wiring member on the actuator so as to make each of the electrode lands face one of the surface electrodes via the bump of an electroconductive material; and pressurizing the stacked wiring member toward the actuator and heating the wiring member to connect the electrode lands and the surface electrodes respectively in a state that the electroconductive material is interposed between each of the electrode lands and one of the surface electrodes.

11. The method for manufacturing liquid droplet jetting apparatus according to claim 10, the method further comprising:

providing on the surface electrodes connecting terminals each having an area smaller than an area of a surface, of one of the surface electrodes, facing one of the electrode lands, at positions, corresponding to the electrode lands respectively, wherein the electrode lands and the surface electrodes are brought into electrical conduction by connecting the electrode lands with the connecting electrodes respectively via the electroconductive material.

12. The method for manufacturing liquid droplet jetting apparatus according to claim 11, wherein the electroconductive material is solder.

13. The method for manufacturing liquid droplet jetting apparatus according to claim 12, wherein upon connecting the connecting terminals with the electrode lands respectively, pressurizing and heating are performed such that a solder overflowing from a gap between each of the connecting terminals and one of the electrode lands spreads on each of the surface electrodes.

* * * * *